(12) United States Patent
Kawamura et al.

(10) Patent No.: US 8,927,194 B2
(45) Date of Patent: Jan. 6, 2015

(54) CHEMICAL AMPLIFIED PHOTORESIST COMPOSITION

(71) Applicant: Sumitomo Chemical Company, Limited, Tokyo (JP)

(72) Inventors: Maki Kawamura, Osaka (JP); Junji Nakanishi, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/651,857

(22) Filed: Oct. 15, 2012

(65) Prior Publication Data

US 2013/0101940 A1  Apr. 25, 2013

(30) Foreign Application Priority Data

Oct. 17, 2011 (JP) .................. 2011-227674
Nov. 10, 2011 (JP) .................. 2011-246241

(51) Int. Cl.
*G03F 7/004* (2006.01)
*G03F 7/028* (2006.01)
*C07D 471/04* (2006.01)
*C07D 221/06* (2006.01)
*G03F 7/039* (2006.01)

(52) U.S. Cl.
CPC .............. *G03F 7/004* (2013.01); *G03F 7/0392* (2013.01); *G03F 7/0045* (2013.01)
USPC ........................ 430/270.1; 430/325

(58) Field of Classification Search
None
See application file for complete search history.

(56) References Cited

U.S. PATENT DOCUMENTS

2003/0114589 A1* 6/2003 Suetsugu et al. .............. 525/132
2005/0227173 A1* 10/2005 Hatakeyama et al. ..... 430/270.1

(Continued)

FOREIGN PATENT DOCUMENTS

JP       11-223937 A       8/1999
JP       11223937 A   *   8/1999
JP    2008-249993 A      10/2008

OTHER PUBLICATIONS

English Translation of JP11223937.*

*Primary Examiner* — Cynthia H Kelly
*Assistant Examiner* — Anna Malloy
(74) *Attorney, Agent, or Firm* — Birch, Stewart, Kolasch & Birch, LLP

(57) ABSTRACT

A chemical amplified photoresist composition containing a resin, an acid generator, and a compound of formula (X):

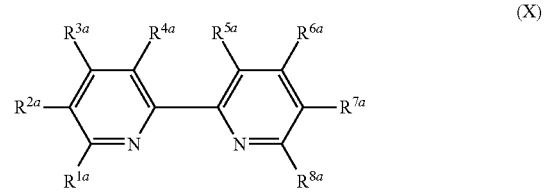

wherein $R^{1a}$, $R^{2a}$, $R^{3a}$, $R^{6a}$, $R^{7a}$ and $R^{8a}$ each independently represent a hydrogen atom, a hydroxyl group, a carboxy group, —$SO_3$, —$NH_2$, a halogen atom, a mercapto group, a C1-C12 alkyl group optionally having a substituent, a C6-C30 aryl group optionally having a substituent, a C3-C12 cycloalkyl group optionally having a substituent, and $R^{4a}$ and $R^{5a}$ each independently represent a hydrogen atom, a hydroxyl group, a carboxy group, —$SO_3$, —$NH_2$, a halogen atom, a mercapto group, a C1-C12 alkyl group optionally having a substituent, a C6-C30 aryl group optionally having a substituent, or a C3-C12 cycloalkyl group optionally having a substituent, or $R^{4a}$ and $R^{5a}$ are bonded each other to form a ring together with carbon atoms binding $R^{4a}$ and $R^{5a}$ and with the carbon atoms forming the bond between the pyridine rings.

10 Claims, 1 Drawing Sheet

(56) References Cited

U.S. PATENT DOCUMENTS

2006/0241276 A1* 10/2006 Inatomi et al. ............... 528/129
2007/0077511 A1* 4/2007 Tredwell et al. .............. 430/201
2008/0153036 A1* 6/2008 Suetsugu et al. ........... 430/287.1

* cited by examiner (a)     (b)

CHEMICAL AMPLIFIED PHOTORESIST COMPOSITION

This nonprovisional application claims priority under 35 U.S.C. §119(a) on Patent Applications No. 2011-227674 filed in JAPAN on Oct. 17, 2011 and No. 2011-246241 filed in JAPAN on Nov. 10, 2011, the entire contents of which are hereby incorporated by reference.

FIELD OF THE INVENTION

The present invention relates to a photoresist composition and a method for producing a photoresist pattern.

BACKGROUND OF THE INVENTION

The process for producing a bump of semiconductor device generally comprises a step of forming a thick photoresist film or photoresist pattern on such layer.

As to photoresist compositions to be used for thick photoresist film or photoresist pattern on such layer, JP2008-249993A1 mentions a positive type photoresist composition which comprises
(A) a polymer comprising 10 to 70% by mole of polymer unit derived from t-butyl(meth)acrylate and 30 to 90% by mole of polymer unit derived from a compound represented by formula (I); $R^1$—(C=$CH_2$)—(C=C)—O—$R^2$, said polymer having weight average molecular weight of 50000 to 300000,
(B) an alkaline-soluble polymer, and
(C) photosensitive acid generator.

SUMMARY OF THE INVENTION

The present application provides the inventions as follow:
[1] A chemical amplified photoresist composition comprising
 a resin,
 an acid generator, and
 a compound of formula (X):

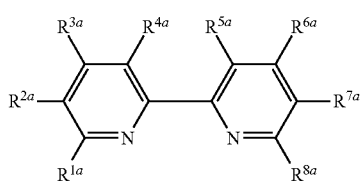

(X)

wherein $R^{1a}$, $R^{2a}$, $R^{3a}$, $R^{6a}$, $R^{7a}$ and $R^{8a}$ each independently represent a hydrogen atom, a hydroxyl group, a carboxy group, —$SO_3$, —$NH_2$, a halogen atom, a mercapto group, a C1-C12 alkyl group optionally having a substituent, a C6-C30 aryl group optionally having a substituent, or a C3-C12 cycloalkyl group optionally having a substituent, and $R^{4a}$ and $R^{5a}$ each independently represent a hydrogen atom, a hydroxyl group, a carboxy group, —$SO_3$, —$NH_2$, a halogen atom, a mercapto group, a C1-C12 alkyl group optionally having a substituent, a C6-C30 aryl group optionally having a substituent, or a C3-C12 cycloalkyl group optionally having a substituent, or $R^{4a}$ and $R^{5a}$ are bonded each other to form a ring together with carbon atoms binding $R^{4a}$ and $R^{5a}$ and with the carbon atoms forming the bond between the pyridine rings.

[2] The chemical amplified photoresist composition according to [1], wherein the compound of formula (X) is a compound of formula (X'):

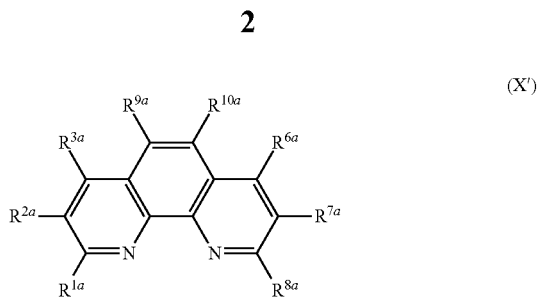

(X')

wherein $R^{1a}$, $R^{2a}$, $R^{3a}$, $R^{6a}$, $R^{7a}$ and $R^{8a}$ are each independently as defined in claim 1, and
$R^{9a}$ and $R^{10a}$ each independently represent a hydrogen atom, a hydroxyl group, a carboxy group, —$SO_3$, —$NH_2$, a halogen atom, a mercapto group, a C1-C12 alkyl group optionally having a substituent, a C6-C30 aryl group optionally having a substituent, or a C3-C12 cycloalkyl group optionally having a substituent.

[3] The chemical amplified photoresist composition according to [1] or [2], wherein $R^{1a}$, $R^{2a}$, $R^{3a}$, $R^{6a}$, $R^{7a}$ and $R^{8a}$ each independently represent a hydrogen atom, a hydroxyl group, a carboxy group, a methyl group or a phenyl group.

[4] The chemical amplified photoresist composition according to any one of [1] to [3], wherein $R^{1a}$, $R^{2a}$, $R^{3a}$, $R^{6a}$, $R^{7a}$ and $R^{8a}$ each independently represent a hydrogen atom, a hydroxyl group, a methyl group or a phenyl group.

[5] The chemical amplified photoresist composition according to any one of [1] to [4], wherein the compound of formula (X) is 2,9-dimethyl-4,7-diphenyl-1,10-phenanthroline, 1,10-phenanthroline, 4,7-dihydroxy-1,10-phenanthroline, or 2,9-dimethyl-1,10-phenanthroline.

[6] The chemical amplified photoresist composition according to any one of [1] to [5], wherein the resin is insoluble or poorly soluble in an aqueous alkali solution but becoming soluble in an aqueous alkali solution by the action of an acid.

[7] The chemical amplified photoresist composition according to any one of [1] to [6], wherein the acid generator is an organic sulfone compound.

[8] The chemical amplified photoresist composition according to any one of [1] to [7], wherein the acid generator is a compound represented by formula (IV) or (VI);

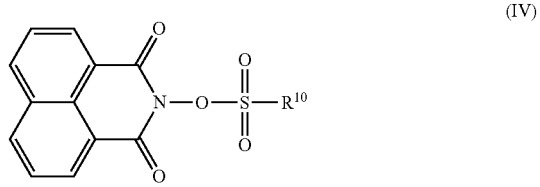

(IV)

where $R^{10}$ represents a C1-C8 perfluoroalkyl group, a C6-C16 aromatic hydrocarbon group optionally having a substituent, a C1-C12 alkyl group optionally having a substituent, or a C3-C16 cycloalkyl group optionally having a substituent,

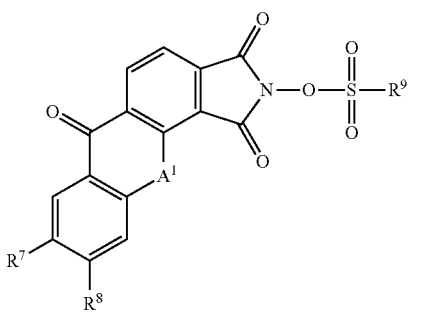

(VI)

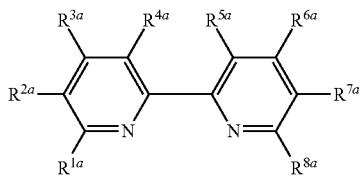

(X)

where $A^1$ represents an oxygen atom or a sulfur atom, $R^7$ and $R^8$ represent hydrogen atom, or a C1-C4 alkyl group, and $R^9$ represents a C1-C8 perfluoroalkyl group.

[9] The chemical amplified photoresist composition according to any one of [1] to [8], wherein the compound of formula (X) amounts to from 0.001 to 1% by mass of the composition.

[10] The chemical amplified photoresist composition according to any one of [1] to [9], which further comprises a solvent.

[11] A process for producing a photoresist pattern comprising:
(1) a step of applying the chemical amplified photoresist composition according to any one of [1] to [10] on a substrate to form a photoresist composition film,
(2) a step of forming a photoresist film by drying the photoresist composition film,
(3) a step of exposing the photoresist film to radiation,
(4) a step of heating the photoresist film after exposing, and
(5) a step of developing the heated photoresist film.

[12] The process according to [11] wherein the substrate comprises a conductive material containing a metal, said metal being selected from the group consisting of gold, copper, nickel, tin and palladium.

[13] The photoresist film obtained by applying the chemical amplified photoresist composition according to any one of [1] to [10] on a substrate, the thickness of said film being in the range from 4 to 150 μm.

DESCRIPTION OF THE PREFERRED INVENTION

Figure 1:
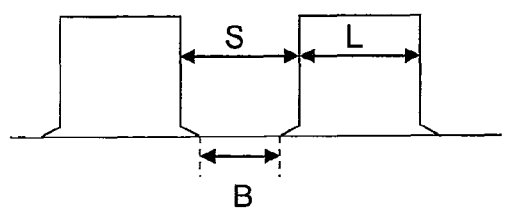
FIG. 1 simply illustrates a typical cross-section view of photoresist pattern in order to explain the method of determining whether the patterns of Examples 1 to 5 and Comparative Example 1 have footing or not.

The chemical amplified photoresist composition of the present invention (hereinafter, such composition is briefly referred to as "the composition of the present invention") comprises
a resin,
an acid generator, and
the compound of formula (X).

The composition of the present invention comprises these components, so that it can provide a photoresist pattern with less footing and less scum but with excellent profile. Moreover, the composition of the present invention can provide such an excellent photoresist pattern as mentioned above even after storage for long term.

The composition of the present invention comprises the compound of formula (X).

In formula (X), $R^{1a}$, $R^{2a}$, $R^{3a}$, $R^{6a}$, $R^{7a}$ and $R^{8a}$ each independently represent a hydrogen atom, a hydroxyl group, a carboxy group, —$SO_3$, —$NH_2$, a halogen atom, a mercapto group, a C1-C12 alkyl group optionally having a substituent, a C6-C30 aryl group optionally having a substituent, or a C3-C12 cycloalkyl group optionally having a substituent.

$R^{4a}$ and $R^{5a}$ each independently represent a hydrogen atom, a hydroxyl group, a carboxy group, —$SO_3$, —$NH_2$, a halogen atom, a mercapto group, a C1-C12 alkyl group optionally having a substituent, a C6-C30 aryl group optionally having a substituent, or a C3-C12 cycloalkyl group optionally having a substituent, or $R^{4a}$ and $R^{5a}$ are bonded each other to form a ring together with carbon atoms binding $R^{4a}$ and $R^{5a}$ and with the carbon atoms forming the bond between the pyridine rings. In $R^{1a}$, $R^{2a}$, $R^{3a}$, $R^{4a}$, $R^{5a}$, $R^{6a}$, $R^{7a}$ and $R^{8a}$, the halogen atom includes fluorine atom, chlorine atom, bromine atom and iodorine atom. In $R^{1a}$, $R^{2a}$, $R^{3a}$, $R^{4a}$, $R^{5a}$, $R^{6a}$, $R^{7a}$ and $R^{8a}$, the alkyl groups include unsubstituted C1-C12 alkyl group such as a methyl group, an ethyl group, a propyl group, a butyl group, a pentyl group, a hexyl group, a heptyl group, an octyl group, a decyl group, and a dodecyl group, and the substituted C1-C12 alkyl group. The substituent of the alkyl group includes a halogen atom, a hydroxyl group, C1-C12 alkoxy groups, C2-C11 acyl groups, C2-C11 acyloxy groups, C6-C30 aryl groups, C7-C11 aralkyl groups and C7-C21 aryloxy groups.

The halogen atom includes those as mentioned above. The alkoxy groups include a methoxy group, an ethoxy group, a propoxy group, a butoxy group, a pentyloxy group, a hexyloxy group, a heptyloxy group, an octyloxy group, a decyloxy group, and a dodecyloxy group.

The acyl groups include an acetyl group, a propionyl group, a butyryl group, a valeryl group, hexanoyl group, a heptanoyl group, an oxalyl group and a benzoyl group.

The acyloxy groups include an acetyloxy group, a propionyloxy group and a butyryloxy group.

The aryl groups include a phenyl group, a naphthyl group, a biphenyl group, an anthryl group, a phenanthryl group and those groups having a substituent such as halogen atom, a hydroxyl group, C1-C12 alkyl groups, C1-C12 alkoxy groups, a carboxyl group or a cyano group.

The aralkyl groups include a benzyl group, a phenethyl group, phenylpropyl group and a naphtylmethyl group.

The alkylcarbonyloxy groups include a group consisting of an acyl group and an oxygen atom.

The aryloxy groups include a phenyloxy group, a naphthyloxy group, a biphenyloxy group, an anthryloxy group, a phenanthryloxy group and those groups having a substituent such as halogen atom, a hydroxyl group, C1-C12 alkyl groups, C1-C12 alkoxy groups, a carboxyl group or a cyano group. In formula (X), the alkyl group is preferably C1-C6 alkyl group, more preferably a methyl group and an ethyl group, still more preferably a methyl group.

In formula (X), the aryl groups include those described as above, which are preferably C6-C12 aryl group, more preferably a phenyl group and a naphtyl group, still more preferably a phenyl group.

In formula (X), the cycloalkyl groups include monocyclic groups such as a cyclopropyl group, a cyclobutyl group, a cyclopentyl group, a cyclohexyl group, a cycloheptyl group, a cyclooctyl group and, a cyclododecyl group, e.g. the groups represented by formulae (KA-1), (KA-2), (KA-3), (KA-4), (KA-5), (KA-6) and (KA-7), and
polycyclic groups, e.g. the groups represented by formulae (KA-8), (KA-9), (KA-10), (KA-11), (KA-12) and (KA-13).

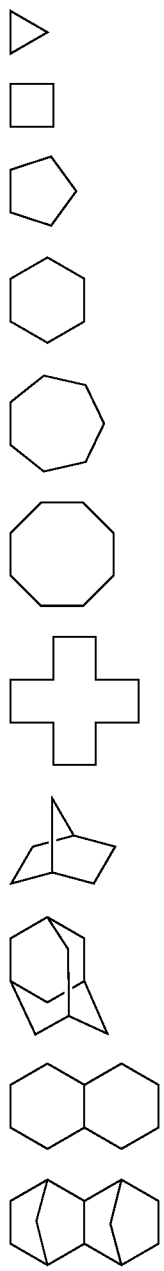

(KA-1)
(KA-2)
(KA-3)
(KA-4)
(KA-5)
(KA-6)
(KA-7)
(KA-8)
(KA-9)
(KA-10)
(KA-11)

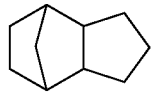
(KA-12)

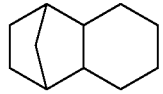
(KA-13)

The cycloalkyl group is preferably C3-C6 cycloalkyl group, more preferably cyclohexyl group.

When $R^{1a}$, $R^{2a}$, $R^{3a}$, $R^{4a}$, $R^{5a}$, $R^{6a}$, $R^{7a}$ or $R^{8a}$ represents an acidic group such as carboxy group or —SO$_3$, the acidic group usually forms a salt with an ammonium ion or the like.

Each of $R^{1a}$, $R^{2a}$, $R^{3a}$, $R^{6a}$, $R^{7a}$ and $R^{8a}$ represents preferably a hydrogen atom, a hydroxyl group, a carboxy group, a methyl group or a phenyl group, more preferably
a hydrogen atom, a hydroxyl group, a methyl group or a phenyl group.

The substituents represented by $R^{4a}$ and $R^{5a}$ are preferably bonded each other to form a ring together with carbon atoms binding $R^{4a}$ and $R^{5a}$ and with the carbon atoms forming the bond between the pyridine rings of formula (X).

The compound of formula (X) is preferably a compound of formula (X'):

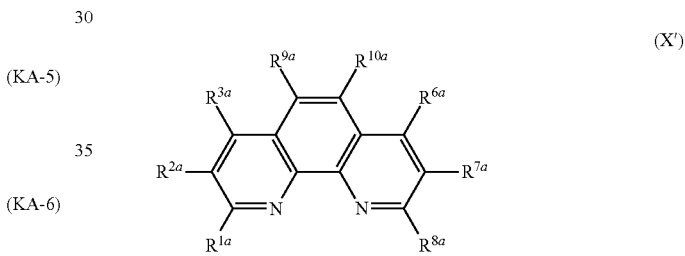
(X')

In formula (X'), $R^{1a}$, $R^{2a}$, $R^{3a}$, $R^{6a}$, $R^{7a}$ and $R^{8a}$ are as defined above.

$R^{9a}$ and $R^{10a}$ each independently represent a hydrogen atom, a hydroxyl group, a carboxy group, —SO$_3$, —NH$_2$, a halogen atom, a mercapto group, a C1-C12 alkyl group optionally having a substituent, a C6-C30 aryl group optionally having a substituent, or a C3-C12 cycloalkyl group optionally having a substituent.

Examples of each substituent represented by $R^{9a}$ and $R^{10a}$ are the same as examples of the substituents represented by $R^{1a}$, $R^{2a}$, $R^{3a}$, $R^{4a}$, $R^{5a}$, $R^{6a}$, $R^{7a}$ and $R^{8a}$, including preferred examples.

The compound of formula (X) is preferably 2,9-dimethyl-4,7-diphenyl-1,10-phenanthroline, 1,10-phenanthroline, 4,7-dihydroxy-1,10-phenanthroline, or 2,9-dimethyl-1,10-phenanthroline.

The content of the compound of formula (X) is usually 0.001 to 1%, preferably 0.01 to 0.3% of the total amount of the composition of the present invention.

The composition of the present invention comprises a resin.

The resin for the composition the present invention is usually one insoluble or poorly soluble in an aqueous alkali solution but becoming soluble in an aqueous alkali solution by the action of an acid.

With such resin as having the above-mentioned properties, the photoresist composition can give a photoresist pattern by an acid generated from the acid generator as mentioned above. Herein, "soluble in an aqueous alkali solution by the action of an acid" means such property as soluble in an aqueous alkali solution by contacting it with into an acid while hardly soluble or insoluble in an aqueous alkali solution before contacting it with into an acid.

The resin for the composition of the present invention generally comprises a structural unit having an acid-labile group. Herein "an acid-labile group" refers to a group capable of being cleaved in case of contacting with an acid to give a hydrophilic group such as a hydroxy group or carboxy group.

Examples of the acid-labile group include a group represented by the formula (1):

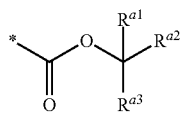

(1)

wherein $R^{a1}$, $R^{a2}$ and $R^{a3}$ independently each represent a C1-C8 alkyl group, a C3-C20 alicyclic hydrocarbon group or a combination of them, or $R^{a1}$ and $R^{a2}$ can be bonded each other to form a C2-C20 divalent aliphatic hydrocarbon group, and * represents a binding position.

Examples of the C1-C8 alkyl group include a methyl group, an ethyl group, a propyl group, a butyl group, a pentyl group, a hexyl group, a heptyl group, and an octyl group.

The alicyclic hydrocarbon group may be monocyclic or polycyclic, which includes a cycloalkyl group such as cyclopentyl group, cyclohexyl group, cycloheptyl group, and cyclooctyl group; polycyclic alicyclic hydrocarbon group such as decahydronaphtyl group, adamantyl group, norbornyl group and the groups represented as follow.

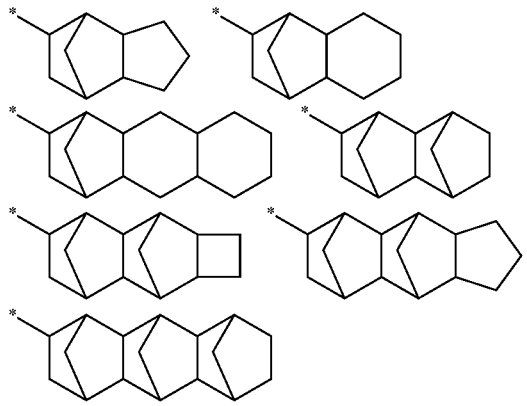

in which * represents a binding position.

The combination of alkyl group and alicyclic hydrocarbon group includes methylcyclohexyl group, dimethylcyclohexyl group, and methylnorbornyl group.

The divalent aliphatic hydrocarbon group formed by $R^{a1}$ and $R^{a2}$ which have bound each other has preferably C3-C12 carbon atoms.

When $R^{a1}$ and $R^{a2}$ are bonded each other to form a ring together with a carbon atom to which $R^{a1}$ and $R^{a2}$ are bonded, examples of the group represented by $-C(R^{a1})(R^{a2})(R^{a3})$ include the following groups.

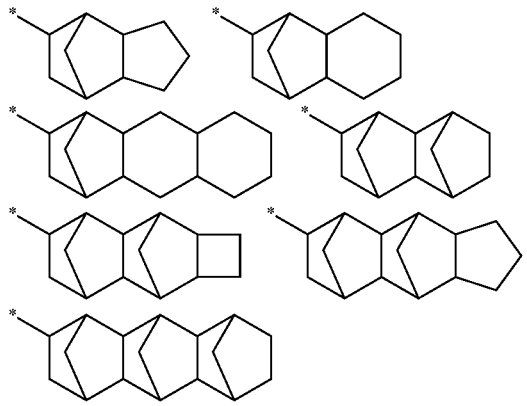

wherein $R^{a3}$ is the same as defined above, and * represents a binding position.

The group represented by the formula (1) includes a group represented by formula (1-1), formula (1-2), formula (1-3) or formula (1-4).

(1-1)

(1-2)

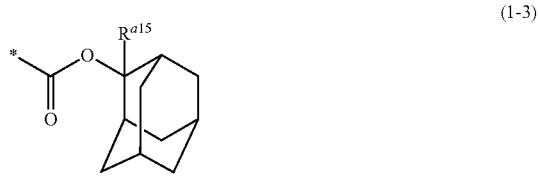

(1-3)

-continued

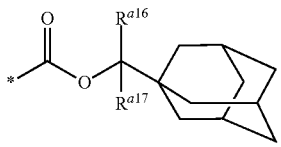
(1-4)

in which $R^{a11}$, $R^{a12}$, $R^{a13}$, $R^{a14}$, $R^{a15}$, $R^{a16}$ and $R^{a17}$ independently each represent a C1-C8 alkyl group.

The group represented by the formula (1) includes preferably tert-butoxycarbonyl group, 1-ethylcyclohexane-1-yloxycarbonyl group, 1-ethyladamantane-2-yloxycarbonyl group, and 2-isopropyladamantane-2-yloxycarbonyl group.

Among them, preferred are those represented by formula (1-1).

Examples of the acid-labile group include a group represented by the formula (2):

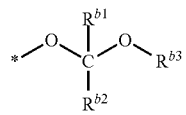
(2)

wherein $R^{b1}$ and $R^{b2}$ independently each represent a hydrogen atom or a C1-C12 monovalent hydrocarbon group, and $R^{b3}$ represents a C1-C20 monovalent hydrocarbon group, and $R^{b2}$ and $R^{b3}$ can be bonded each other to form a C2-C20 divalent hydrocarbon group, and a methylene group in the hydrocarbon group and the ring can be replaced by —O— or —S—, and * represents a binding position, provided that the group represented by the formula (2) does not attach to a carbon atom of carbonyl group.

Examples of the hydrocarbon group include an alkyl group, an alicyclic hydrocarbon group and an aromatic hydrocarbon group. Examples of the alkyl group for formula (2) include a methyl group, an ethyl group, a propyl group, a butyl group, a pentyl group, a hexyl group, a heptyl group, an octyl group, a decyl group, and a dodecyl group.

Examples of the alicyclic hydrocarbon group for formula (2) include those as mentioned above.

Examples of the aromatic hydrocarbon group include an aryl group such as a phenyl group, a naphthyl group, an anthryl group, a biphenyl group, a phenanthryl group and a fluorenyl group, which include those having a C1-C8 alkyl group.

It is preferred that at least one of $R^{b1}$ and $R^{b2}$ is a hydrogen atom.

Examples of the group represented by the formula (2) include the following;

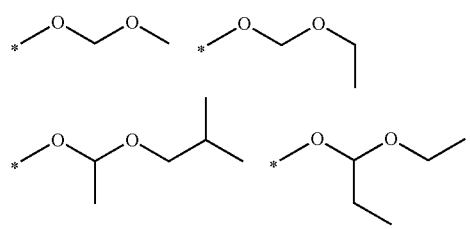

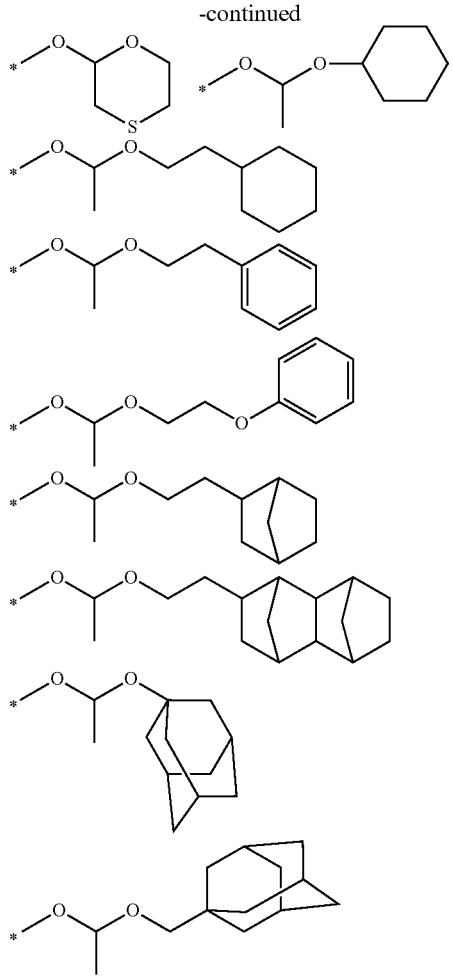

where * represents a binding position.

The structural unit having an acid-labile group is preferably one derived from a monomer having an acid-labile group in its side chain and a carbon-carbon double bond, and is more preferably one derived from a (meth)acrylate monomer having an acid-labile group in its side chain and one derived from a styrene monomer having an acid-labile group in its side chain. The (meth)acrylate monomer having the group represented by the formula (1) or (2) in its side chain in its side chain is especially preferable.

Examples of the (meth)acrylate monomer having the group represented by the formula (1) or (2) include the compound of the formula (1-1-1).

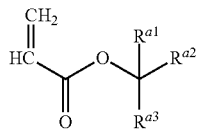
(1-1-1)

where $R^{a1}$, $R^{a2}$ and $R^{a3}$ are as defined above.

The structural unit derived from a styrene compound having an acid-labile group typically comprises a side chain in which a phenolic hydroxyl group has been protected with a protecting group capable of being removed by action of an acid. The structural unit derived from a styrene compound having an acid-labile group is typically represented by formula (S).

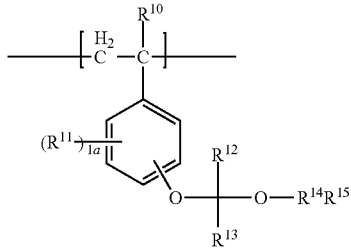

in which $R^{10}$ represents a hydrogen atom, a halogen atom, or a C1-C6 alkyl group optionally having a halogen atom, $1^a$ represents an integer of 0 to 4, $R^{11}$ represents independently in each occurrence a halogen atom, a hydroxy group, a C1-C6 alkyl group, a C1-C6 alkoxy group, a C2-C4 acyl group, a C2-C4 acyloxy group, an acryloyl group or a methacryloyl group, $R^{12}$ and $R^{13}$ independently in each occurrence represent a hydrogen atom or C1-C12 hydrocarbon group, $R^{14}$ represents a single bond or a C1-C12 alkylene group where a methylene group may be replaced by an oxygen atom, a sulfur atom, a carbonyl group, a sulfonyl group, or —N($R^c$)— where $R^c$ represents a hydrogen atom or a C1-C6 alkyl group, and $R^{15}$ represents a C1-C18 hydrocarbon group optionally having a substituent.

In formula (S), the hydrocarbon group includes a C1-C18 alkyl group such as a methyl group, an ethyl group, a propyl group, a butyl group, a pentyl group, a hexyl group, a heptyl group, an octyl group, a decyl group, and a dodecyl group;

a C3-C18 cycloalkyl group such as a cyclopropyl group, a cyclobutyl group, a cyclopentyl group, a cyclohexyl group, a cycloheptyl group, a cyclooctyl group, a cyclodecyl group, a cyclododecyl group and an adamantyl group; and a C6-C18 aryl group such as a phenyl group, a naphthyl group, an anthryl group, biphenyl group, phenanthryl group, fluorenyl group.

The substituent for the hydrocarbon group in formula (S) includes the same groups as explained regarding $R^{1a}$, $R^{2a}$, $R^{3a}$, $R^{4a}$, $R^{5a}$, $R^{6a}$, $R^{7a}$, $R^{7a}$ and $R^{8a}$.

The resin for the composition of the present invention preferably comprises a structural unit having no acid-labile group together with the structural unit having an acid-labile group, which is described in JP2008-249993A1.

The structural unit having no acid-labile group is preferably what is derived from a monomer selected from the group consisting of (meth)acrylates and styrene-containing compounds.

When the photoresist composition comprises a resin which comprises a structural unit derived from a (meth)acrylate having no acid-labile group or a styrene-containing compound having no acid-labile group, the composition can easily provide a thick photoresist film.

Examples of the (meth)acrylates having no acid-labile group include a compound of formula (I);

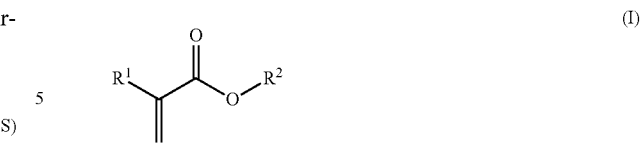

in which $R^1$ represents a hydrogen atom or a methyl group, $R^2$ represents a group of formula (II);

in which $R^3$ represents C1-C6 alkanediyl group, $R^4$ represents C1-C6 alkyl group or C3-C10 cycloalkyl group, and n represent an integer of 1 to 30.

In formulae (I) and (II), the alkyl group includes a methyl group, an ethyl group, a propyl group, a butyl group, a pentyl group, and a hexyl group, preferably C1-C4 alkyl group. The cycloalkyl group includes a cyclopentyl group, a cyclohexyl group, a cycloheptyl group, a cyclooctyl group, and an adamantyl group, preferably C6-C10 cycloalkyl group. In formula (II), the alkanediyl group includes a methylene group, an ethylene group, a propylene group, a butylene group, a pentylene group, and a hexylene group.

The n is preferably an integer of 2 to 16, more preferably an integer of 2 to 8. When the group of formula (II) has two or more moieties represented by —$R^3$—O—, the moieties may be the same as or different from each other.

Examples of the compound of formula (I) include ethylenegrylcolmonomethylether(meth)acrylate, ethylenegrylcolmonoethylether(meth)acrylate, ethylenegrylcolmonopropylether(meth)acrylate, ethylenegrylcolmonombutylether(meth)acrylate, diethylenegrylcolmonomethylether(meth)acrylate, triethylenegrylcolmonomethylether(meth)acrylate, tetraethylenegrylcolmonomethylether(meth)acrylate, pentaethylenegrylcolmonobutylether(meth)acrylate, hexaethylenegrylcolmonomethylether(meth)acrylate, nonaethylenegrylcolmonomethylether(meth)acrylate, octaethylenegrylcolmonomethylether(meth)acrylate, or polyethylenegrylcolmonomethylether(meth)acrylate.

Among them, the compound of formula (I) is preferably of the formula in which $R^2$ represents a group of formula (II).

The styrene-containing compound having no acid labile group includes one from which a structural unit of the following formula is derived;

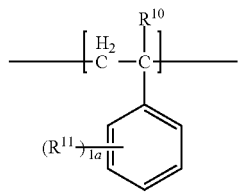

where $R^{10}$ and $1^a$ are as defined above, and $R^{11a}$ represents independently in each occurrence a hydrogen atom, a halogen atom, a hydroxy group, a C1-C6 alkyl group, a C1-C6 alkoxy group, a C2-C4 acyl group, a C2-C4 acyloxy group, an acryloyl group or a methacryloyl group.

Examples of the styrene-containing compound specifically include hydroxystyrene.

Examples of the resin for the composition of the present invention preferably include the resin which comprises a structural unit derived from tert-butyl(meth)acrylate and a structural unit derived from the compound of formula (I) in which $R^2$ represents a group of formula (II), and the resin which comprises a structural unit represented by the formula (S) and a structural unit derived from hyrdoxystyrene, more preferably the resin which comprises a structural unit derived from tert-butyl(meth)acrylate and a structural unit derived from the compound of formula (I) in which $R^2$ represents a group of formula (II).

Examples of the resin having an acid-labile group specifically include a copolymer of tert-butyl(meth)acrylate, octaethylenegrylcolmonomethylether(meth)acrylate and diethylenegrylcolmonomethylether(meth)acrylate.

The weight average molecular weight of the resin having an acid-labile group is preferably from 50000 to 300000 determined by polystyrene as the standard.

Examples of the resin for the composition of the present invention further include a polymer which comprises a structural unit derived from novolak resin and a structural unit derived from poly (hydroxystyrene) and has cross-linking structure derived from a vinyl ether compound. Hereinafter, the polymer which comprises a structural unit derived from novolak resin and a structural unit derived from poly(hydroxystyrene) and has cross-linking structure derived from a vinyl ether compound is referred to as "resin (A)"

The novolak resin is usually produced by a reaction of a phenol compound and an aldehyde compound in the presence of an acid catalyst, as described later.

Examples of the poly(hydroxystyrene) include poly(o-hydroxystyrene), poly(m-hydroxystyrene) and poly(p-hydroxystyrene), preferably poly(p-hydroxystyrene).

As the poly(hydroxystyrene), a commercially available one may be used and one produced according to a known method may be used.

As the vinyl ether compound, a compound having two vinyl ether structures may be used and a compound having more than three vinyl ether structures may be used. The compound having two vinyl ether structures is preferable. Herein, "the vinyl ether structure" means the following structure:

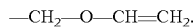

Specific examples of the vinyl ether compound include 1,4-bis(vinyloxymethyl)cyclohexane and 1,2-bis(vinyloxy)ethane, and 1,4-bis(vinyloxymethyl)cyclohexane is preferable. As the vinyl ether compound, a commercially available one is usually used.

The resin (A) can be produced by reacting the novolak resin, the poly(hydroxystyrene) and the vinyl ether compound in the presence of an acid catalyst, as described in US2008/0153036A1.

When the composition of the present invention comprises the resin which comprises a structural unit derived from a (meth)acrylate having no acid-labile group or a styrene-containing compound having no acid-labile group together with a structural unit having an acid-labile group, it is preferred that the composition further comprise an alkali-soluble resin. When the composition of the present invention comprises these two resins, the composition can provide a photoresist film with improved resistance to leaching.

Examples of the alkali-soluble resin include novolak resins. The novolak resins can be produced by condensing a phenolic compound with an aldehyde in the presence of a catalyst. The phenolic compound includes phenol; o-, m- or p-cresol; 2,3-, 2,5-, 3,4- or 3,5-xylenol; 2,3,5-avianmethylphenol, 2-, 3- or 4-tert-butylphenol; 2-tert-butyl-4-or 5-methylphenol; 2-, 4- or 5-methylresorcinol; 2-, 3- or 4-methoxyphenol; 2,3-, 2,5- or 3,5-dimethoxyphenol; 2-methoxyresorcinol; 4-tert-butylcatechol; 2-, 3- or 4-eth-ylphenol; 2,5- or 3,5-diethylphenol; 2,3,5-triethylphenol; 2-naphthol; 1,3-, 1,5- or 1,7-dihydroxynaphthalene; and polyhydroxytriphenylmethane compounds obtained by condensation with xylenol and hydroxybenzaldehyde.

One or more phenolic compounds can be employed for producing the novolak resin.

Among them, preferred are o-cresol, m-cresol, p-cresol, 2,3-xylenol, 2,5-xylenol, 3,4-xylenol, 3,5-xylenol, 2,3,5-avianmethylphenol, 2-t-butylphenol, 3-t-butylphenol, 4-t-butylphenol, 2-t-butyl-4-methylphenol, 2-t-butyl-5-methylphenol.

The aldehyde includes aliphatic aldehydes such as formaldehyde, acetaldehyde, propionaldehyde, n-butyraldehyde, isobutyraldehyde acrolein or croton aldehyde; alicyclic aldehydes such as cyclohexane aldehyde, cyclopentane aldehyde, furfuraldehyde or furylacrolein; aromatic aldehydes such as benzaldehyde, o-, m- or p-methylbenzaldehyde, p-ethylbenzaldehyde, 2,4-, 2,5-, 3,4- or 3,5-dimethylbenzaldehyde or o-, m- or p-hydroxybenzaldehyde; and aldehydes such as phenyl acetaldehyde or cinnamaldehyde, preferably formaldehyde because of its availability. The catalyst to be used for condensation of the phenolic compound with aldehydes includes inorganic acids such as hydrochloric acid, sulfuric acid, perchloric acid or phosphoric acid; and organic acids such as formic acid, acetic acid, oxalic acid, trichloroacetic acid or p-toluenesulfonic acid; and salts of divalent metal, such as zinc acetate, zinc chloride or acetic acid magnesium.

Two or more catalysts may be employed together for the condensation.

The catalyst is generally used in an amount of from 0.01 to 1 mol per mol of aldehyde.

The condensation reaction of phenolic compound with aldehyde may be conducted in a known manner.

For example, the reaction can be carried out by mixing phenolic compound and aldehyde, at temperature in the range of 60 to 120° C., in a suitable solvent to react them, for 2 to 30 hours. After the reaction end, novolak resins can be separated by washing the reaction mixture with water, and concentrating it. If necessary, water-insoluble solvents may be added to the reaction mixture before washing the mixture with water.

The weight average molecular weight of the alkali-soluble resin such as novolak resins is not limited to specific range, preferably from 5000 to 50000 determined by polystyrene as the standard.

If the composition of the present invention further comprises an alkali-soluble resin, the alkali-soluble resin may be used in the mass ratio [the resin for the composition of the present invention/the alkali-soluble resin] of preferably 1/4 to 4/1, more preferably 1/2 to 3/2. The content of the resin is usually 5 to 70% by weight, preferably 5 to 60% by weight, more preferably 25 to 60% by weight, of the total amount of the composition of the present invention.

The composition of the present invention comprises an acid generator.

The acid generator is a compound which can be decomposed by light or radiation to generate an acid. The composition of the present invention can provide a photoresist pattern because the resin of the composition is decomposed by an acid generated from the acid generator.

The acid generators may be either ionic or non-ionic one. The acid generator can be used singly or as a mixture of two or more thereof.

Examples of the acid generators include onium salts, halogen compounds, diazoketone compounds, sulfone compounds and sulfonic acid compounds. The acid generator is preferably a sulfone compound or a sulfonic acid compound. The sulfone compound or sulfonic acid compound preferably comprises a sulfonium cation, a sulfonate anion, or both of them. Examples of the ionic acid generators include the compounds of formulae (Va), (Vb), (Vc) and (III);

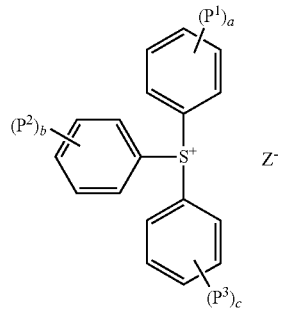

where $P^1$, $P^2$ and $P^3$ independently each represents a hydrogen atom, a hydroxyl group, C1-C6 alkyl group or C1-C6 alkoxy group,
a, b and c independently each represents an integer of 0 to 3, and $Z^-$ represents an organic counter ion,

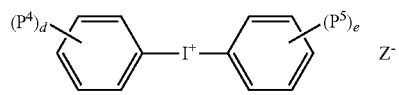

where $P^4$ and $P^5$ independently each represents a hydrogen atom, a hydroxyl group, C1-C6 alkyl group or C1-C6 alkoxy group, d and e independently each represents an integer of 0 or 1, and $Z^-$ represents an organic counter ion,

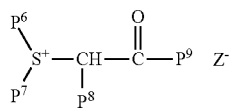

where $P^6$ and $P^7$ independently each represents C1-C6 alkyl group or C3-C10 cycloalkyl group, or $P^6$ and $P^7$ are bonded each other to form, together with $S^+$, a C3-C7 hydrocarbon ring where a mehylene group has been replaced by a carbonyl group, an oxygen atom or a sulfur atom;
$P^8$ represents a hydrogen atom;
$P^9$ represents C1-C6 alkyl group, C3-C10 cycloalkyl group, or an aromatic hydrocarbon group optionally having a substituent, or $P^8$ and $P^9$ are bonded each other to form, together with a carbon atom, a hydrocarbon ring, and
$Z^-$ represents an organic counter ion;

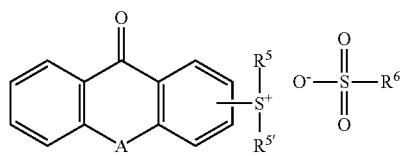

where A represents an oxygen atom or a sulfur atom, $R^5$ and $R^{5'}$ independently each represents a methyl group or a phenyl group, $R^6$ represents a C1-C8 perfluoroalkyl group, and $Z^-$ represents an organic counter ion.

In formulae (Va), (Vb), (Vc) and (III), the C1-C6 alkyl group includes a methyl group, an ethyl group, a propyl group, a butyl group, a pentyl group, and a hexyl group. The C3-C10 cycloalkyl group includes a cyclopentyl group, a cyclohexyl group, a cycloheptyl group and a cyclooctyl group. The aromatic hydrocarbon group includes a phenyl group, a naphthyl group, an anthryl group, a p-methylphenyl group, a p-tert-butylphenyl group and a p-adamantylphenyl group. The C1-C8 perfluoroalkyl group includes a trifluoromethyl group, a pentafluoroethyl group, a heptafluoropropyl group, a nonafluorobutyl group, an undecafluoropentyl group and a tridecafluorohexyl group.

Examples of the cation moiety of formula (Va) specifically include the moieties as follow.

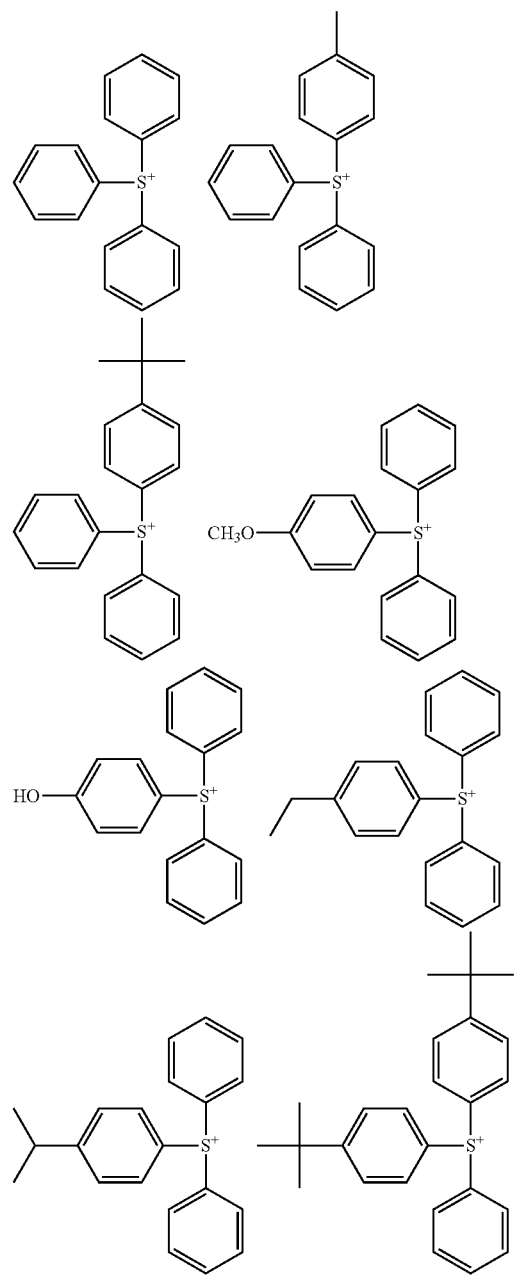

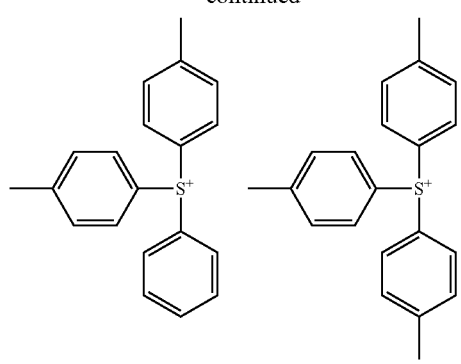
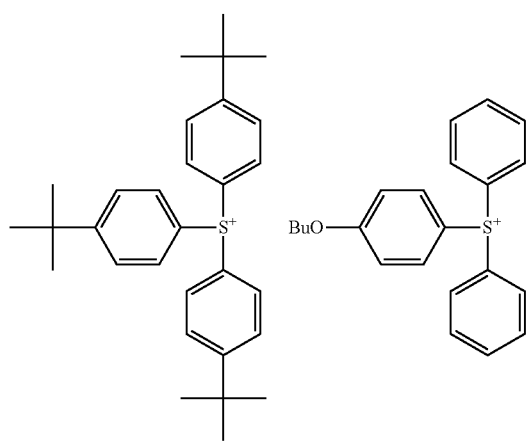
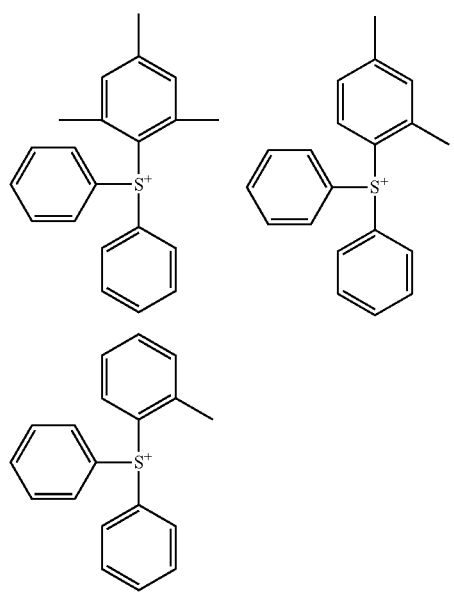
Examples of the cation moiety of formula (Vb) specifically include the moieties as follow.
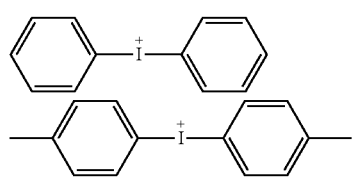
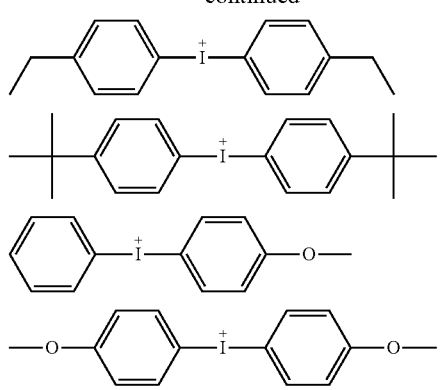
Examples of the cation moiety of formula (Vc) include the moieties as follow.
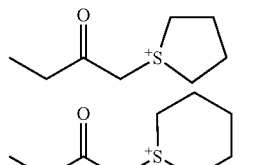
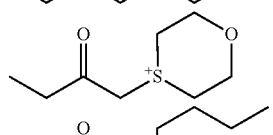
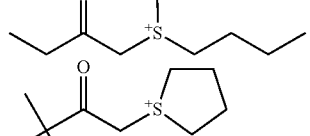
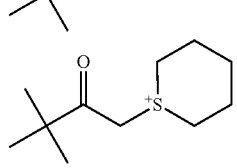
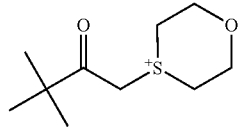
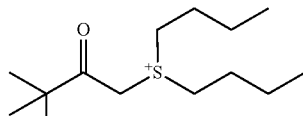
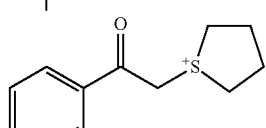
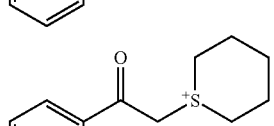

-continued
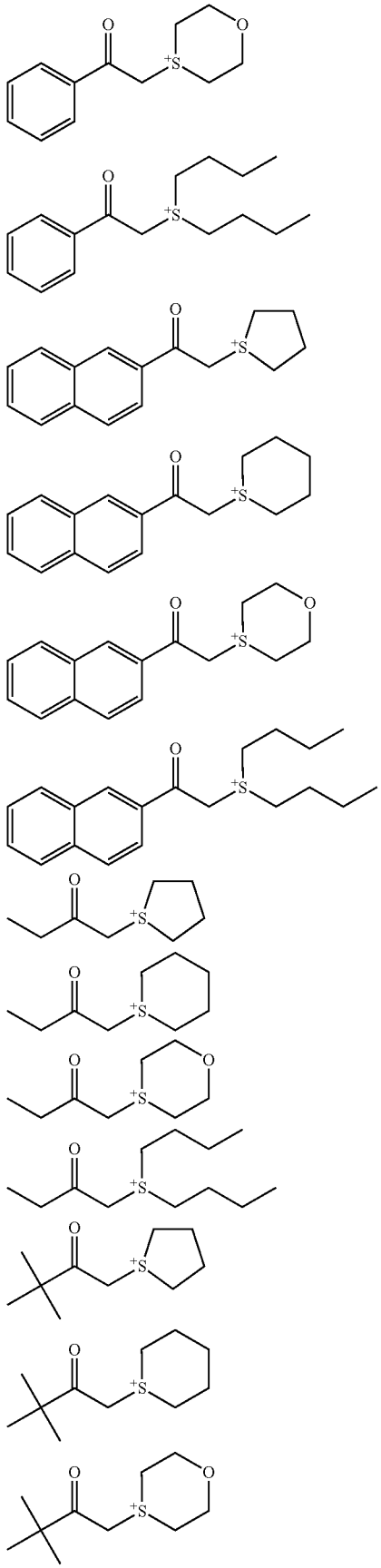
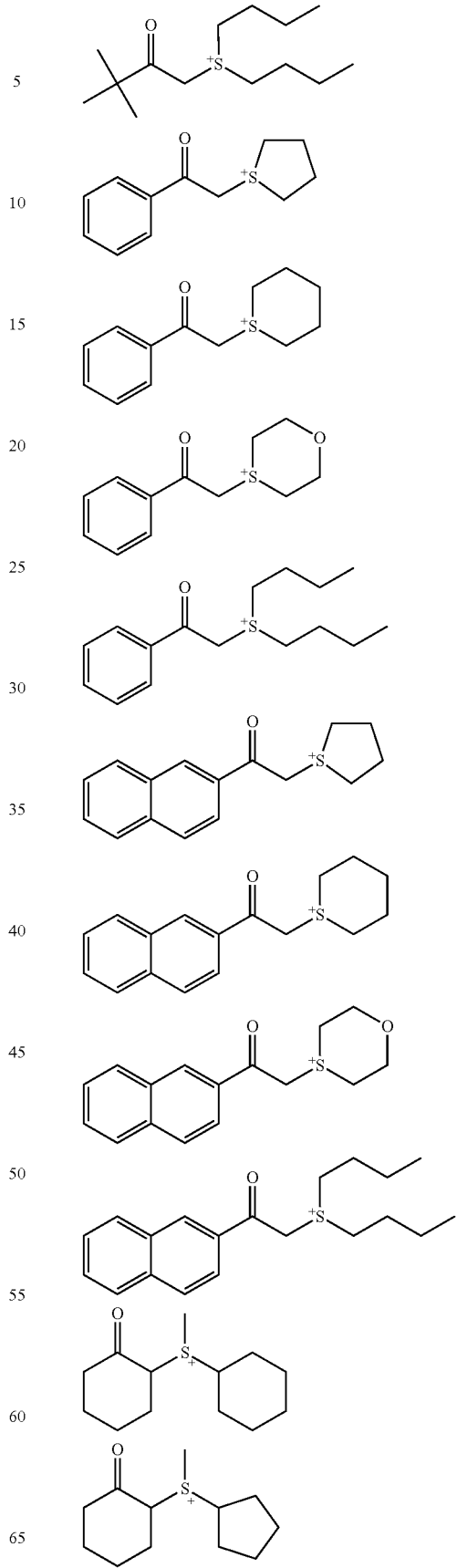

Examples of the cation moiety of formula (III) include the moieties as follow.

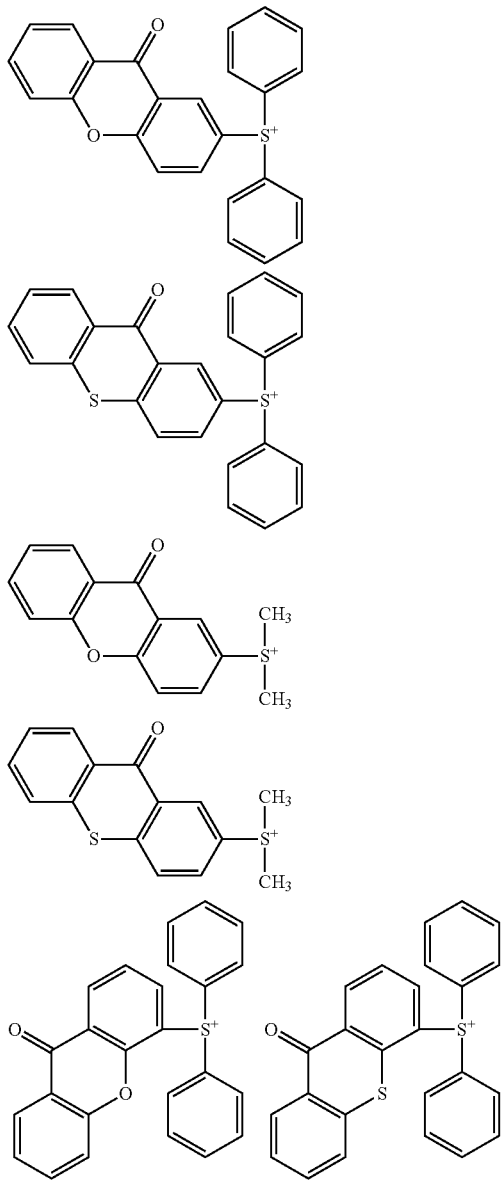

Examples of the organic anion represented by Z⁻ of formulae (Va), (Vb), (Vc) and (III) include an anion of formula (VII).

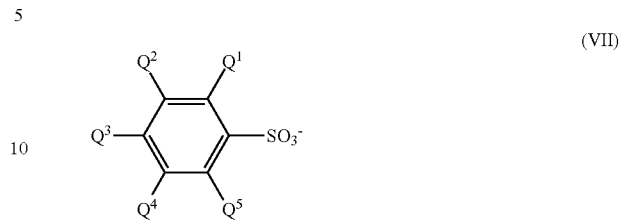

where $Q^1$, $Q^2$, $Q^3$, $Q^4$ and $Q^5$ independently represent a hydrogen atom, a halogen atom, —CHO, a C1-C16 alkyl group, a C1-C16 alkoxy group, a C1-C8 halogenated alkyl group, a C6-C12 aryl group, a C7-C12 aralkyl group, a cyano group, a C1-C4 alkylthio group, a C1-C4 alkylsulfonyl group, a hydroxyl group, a nitro group, or a group of formula (VIII);

where $R^{b1}$ represents an C1-C16 chain alkanediyl group in which a methylene group may be replaced by an oxygen atom or a sulfur atom, and $Cy^1$ represents a C3-C20 alicyclic hydrocarbon group. In formula (VII), the alkyl group includes a methyl group, an ethyl group, a propyl group, a butyl group, a pentyl group, a hexyl group, a heptyl group, an octyl group, a decyl group, a dodecyl group, a hexadecyl group, a pentadecyl group, and a hexadecyl group. The alkoxy group includes a methoxy group, an ethoxy group, a propoxy group, a butoxy group, a pentoxy group, a hexyloxy group, a heptyloxy group, an octyloxy group, a decyloxy group, a dodecyloxy group, a hexadecyloxy group, a pentadecyloxy group, and a hexadecyloxy group. The halogenated alkyl group may have one or more halogen, preferably fluorine atoms, which include a perfluoromethyl group, a perfluoroethyl group, a perfluoropropyl group, a perfluorobutyl group. The aryl group may have substituent, which includes a phenyl group, a tolyl group, a methoxyphenyl group and a naphthyl group. The C7-C12 aralkyl group includes benzylic, chlorobenzylic, and methoxybenzylic. The C1-C4 alkylthio group includes methylthio group, ethylthio group, propylthio group and a butylthio group. The C1-C4 alkylsulfonyl group includes a methylsulfonyl group, an ethylsulfonyl group, propylsulfonyl group and a butylsulfonyl.

The C1-C16 chain alkanediyl group represented by $R^{b1}$ includes a methylene group, an ethylene group, a propylene group, a butylene group, a pentylene group and a hexylene group. The C1-C16 chain alkanediyl group in which a methylene group has been replaced by an oxygen atom or a sulfur atom include C1-C15 alkyleneoxy groups, C2-C14 alkyleneoxyaklylene groups, C1-C15 alkylenethio groups and C2-C14 alkylenethioaklylene groups. $R^{b1}$ specifically includes the groups of formulae (a-1) to (a-15).

| | |
|---|---|
| —CH₂— | (a-1) |
| —CH₂—CH₂— | (a-2) |
| —CH₂—CH₂—CH₂— | (a-3) |
| —CH₂—CH₂—CH₂—CH₂— | (a-4) |

—CH₂—CH₂—CH₂—CH₂—CH₂— (a-5)

—CH₂—CH₂—CH₂—CH₂—CH₂—CH₂— (a-6)

—CH₂—CH₂—CH₂—CH₂—CH₂—CH₂—CH₂—CH₂— (a-7)

—CH₂—O— (a-8)

—CH₂—O—CH₂— (a-9)

—CH₂—O—CH₂—CH₂— (a-10)

—CH₂—CH₂O—CH₂—CH₂— (a-11)

—CH₂—S— (a-12)

—CH₂—S—CH₂— (a-13)

—CH₂—S—CH₂—CH₂— (a-14)

—CH₂—CH₂—S—CH₂—CH₂— (a-15)

The C3-C20 alicyclic hydrocarbon group represented by Cy¹ includes C3-C20 cycloalkyl group such as a cyclopropyl group, a cyclobutyl group, a cyclopentyl group, a cyclohexyl group, a cycloheptyl group, a cyclooctyl group and, a cyclododecyl group and polycyclic groups e.g. adamantyl group or norbornyl group, which specifically includes the groups of formulae (b-1) to (b-26).

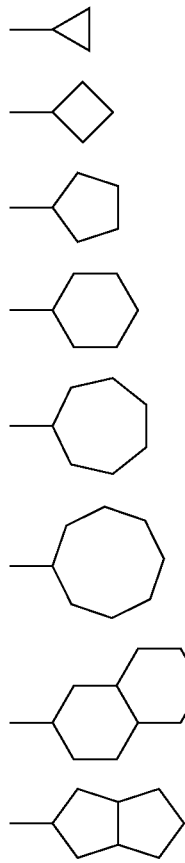

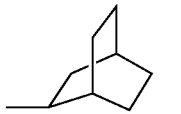

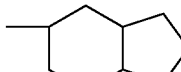

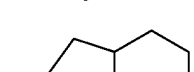

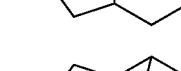

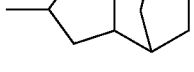

Cy¹ preferably represents cyclohexyl group, norbornyl group, an adamantyl group such as one of formula (b-23) or (b-24). The sulfonate anions of formula (VII) specifically include the anions as follow.

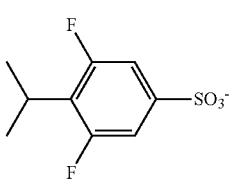

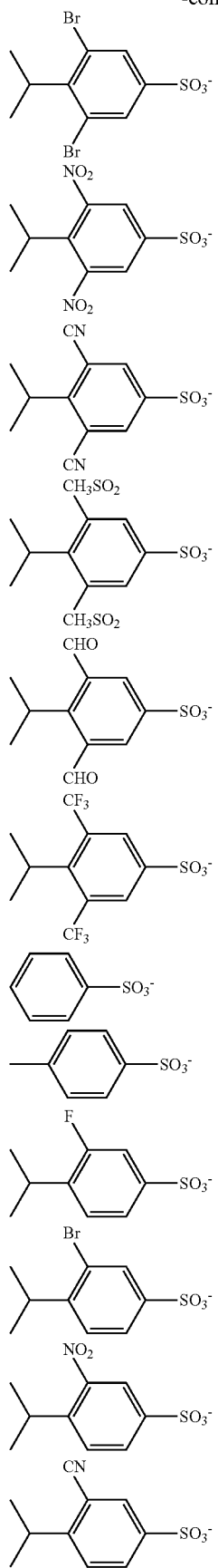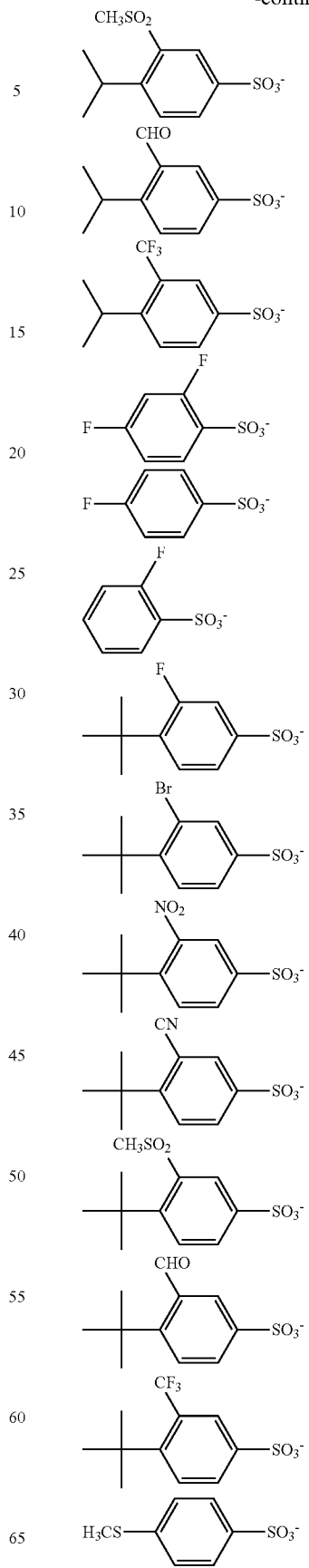

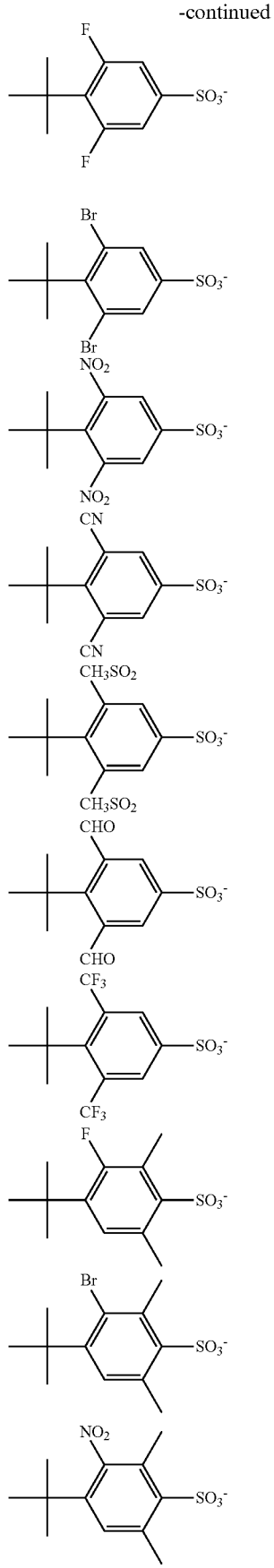
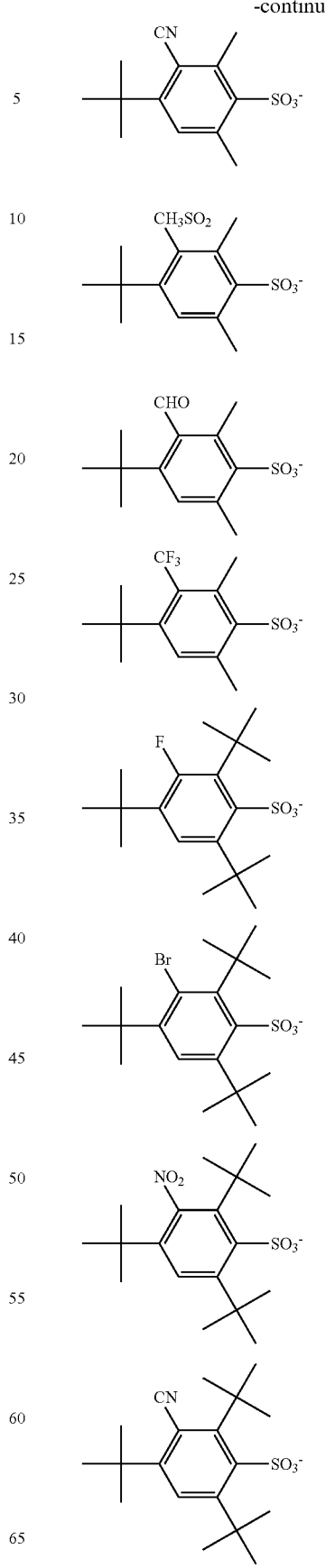

-continued
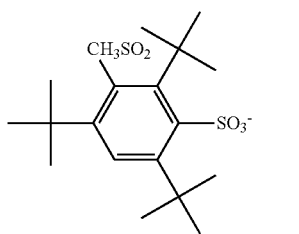
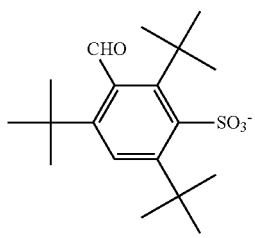
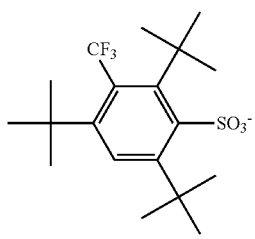
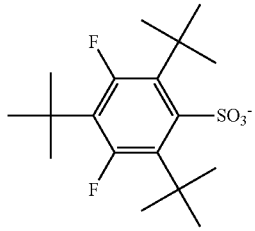
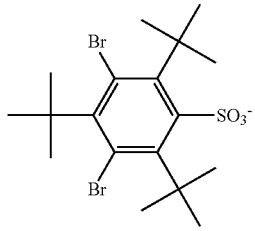
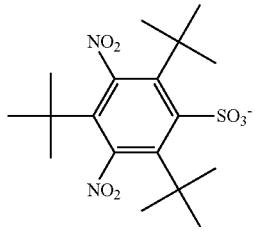
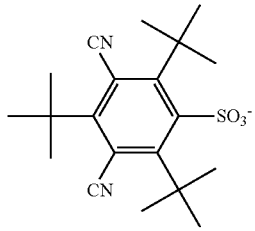
-continued
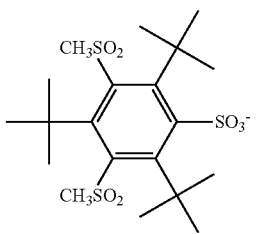
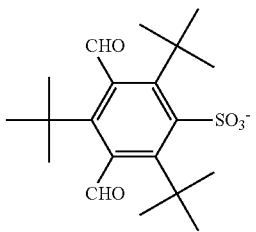
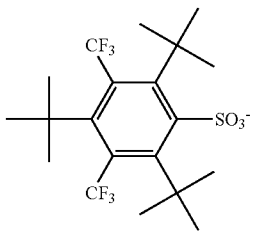
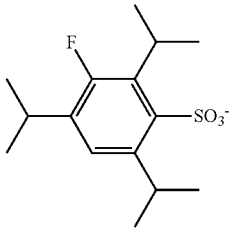
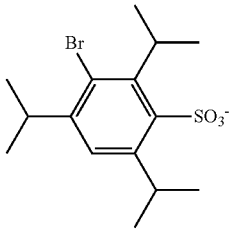
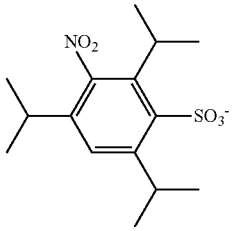
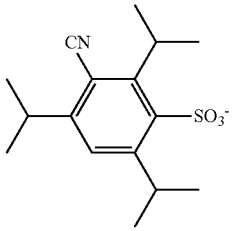

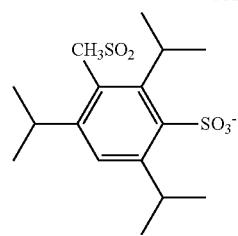
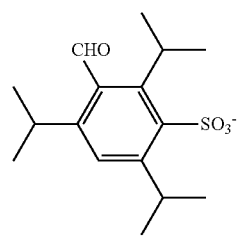
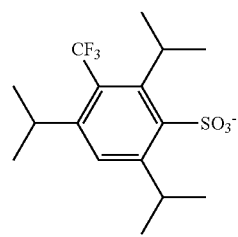
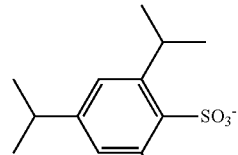
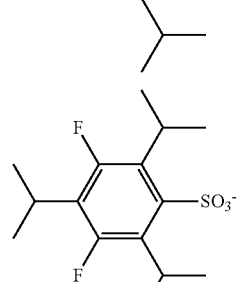
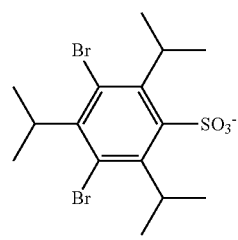
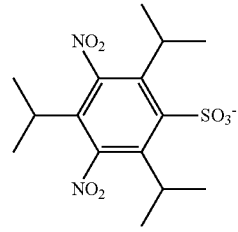
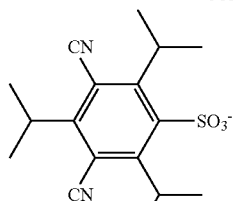
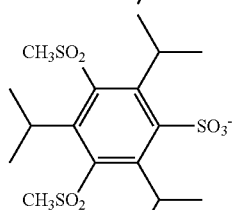
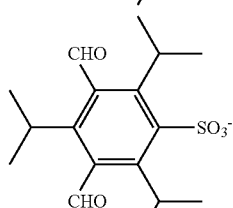
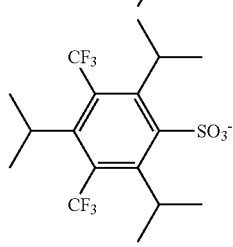
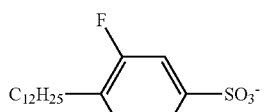
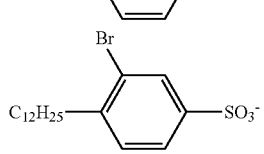
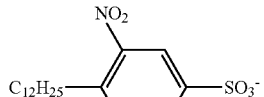
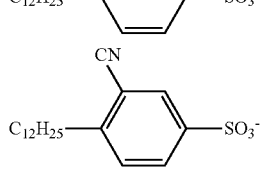
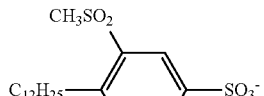
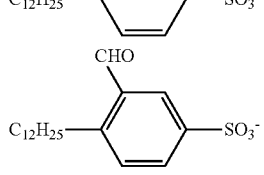

33
-continued
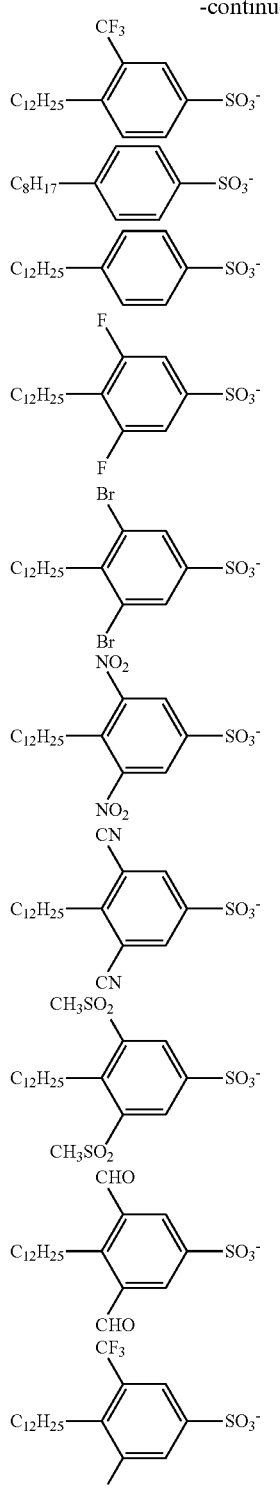
34
-continued
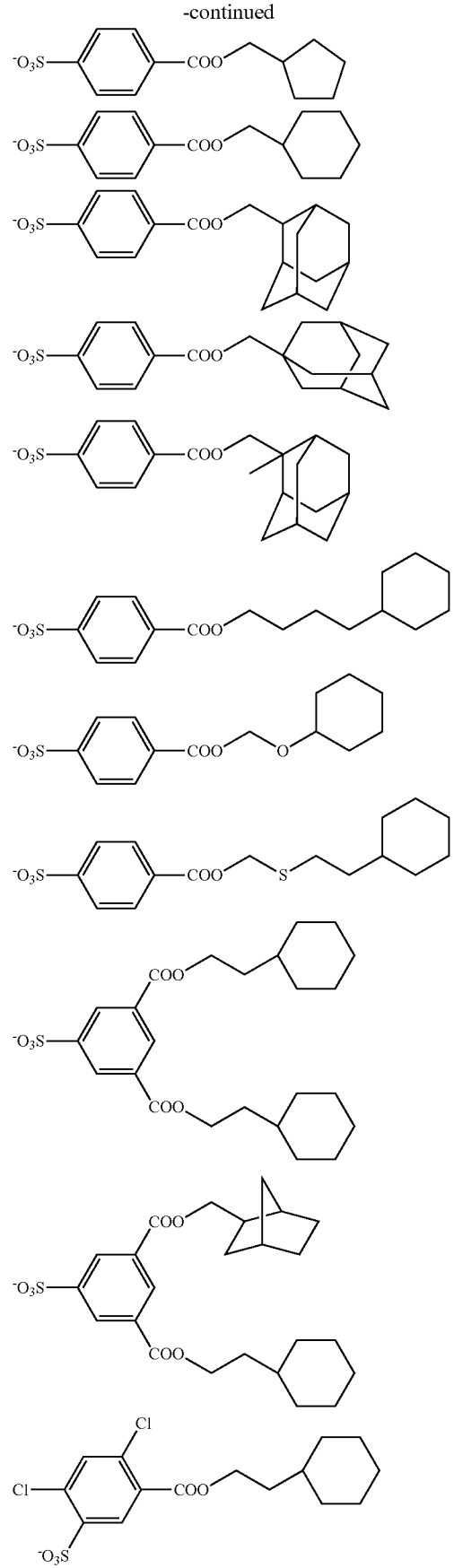

-continued
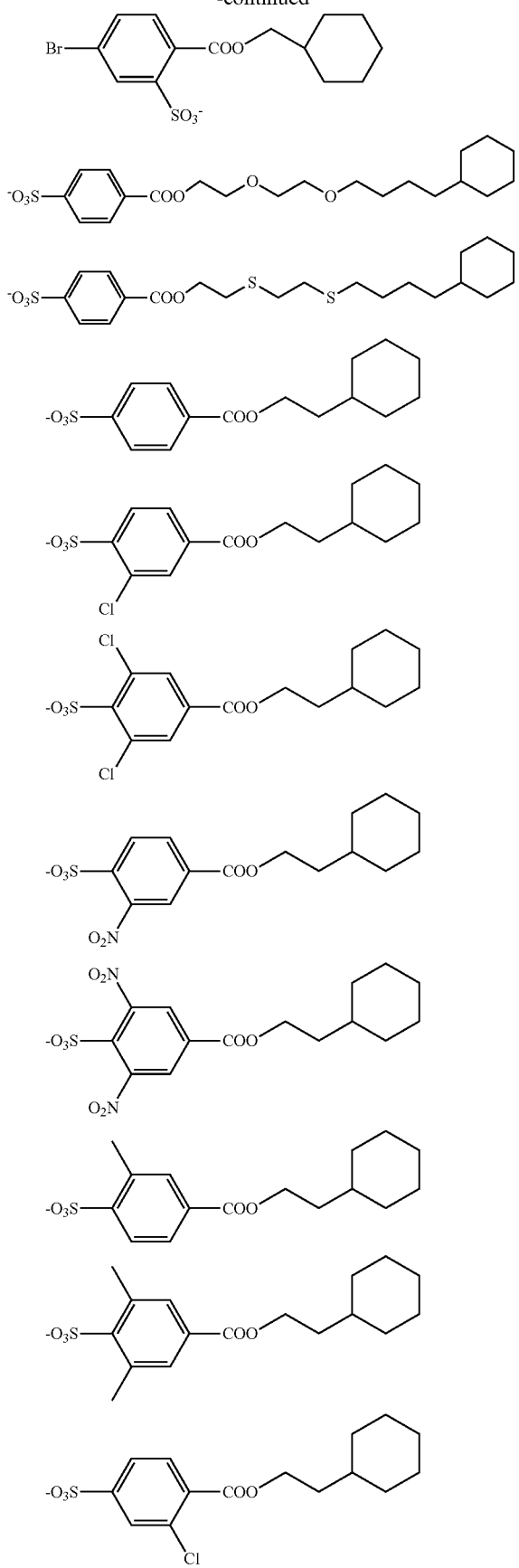
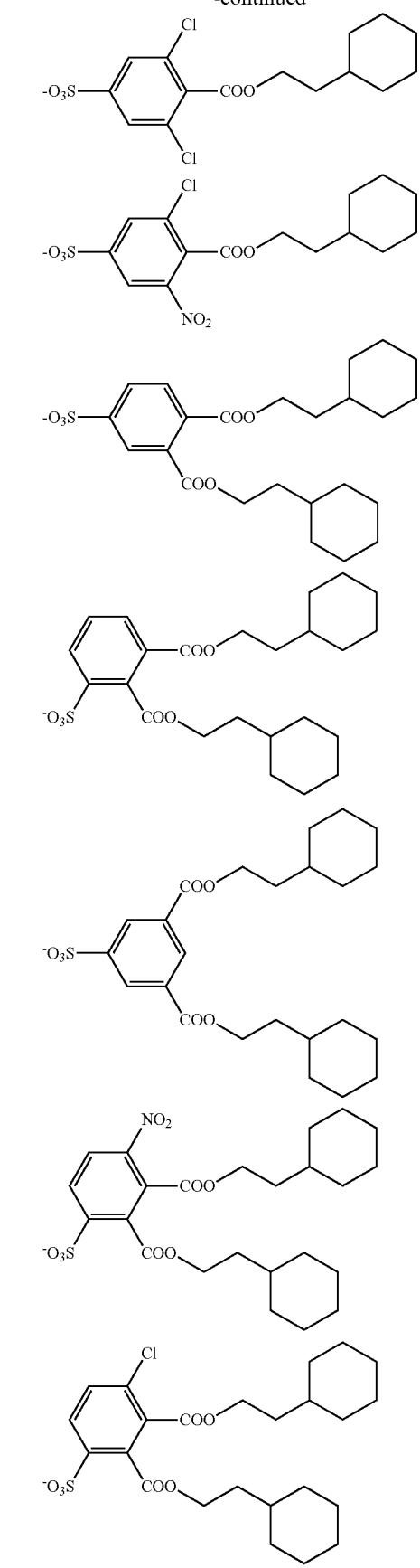

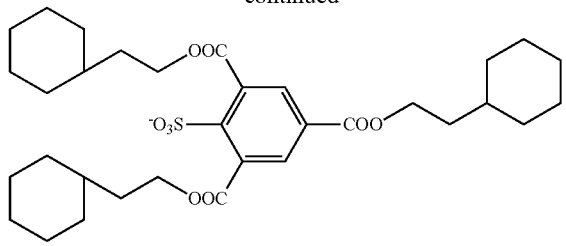

Examples of the organic anion represented by Z⁻ of formulae (Va), (Vb), (Vc) and (III) include that of formula (VIIIa).

$$^{\ominus}SO_3-Q^6 \qquad (VIIIa)$$

where $Q^6$ represents a C1-C20 perfluoroalkyl group, a naphtyl group optionally having a substituent, or an anthryl optionally having a substituent.

In formula (VIIIa), the perfluoroalkyl group includes the perfluoroalkyl group such as a trifluoromethyl group, a pentafluoroethyl group, a heptafluoropropyl group, a nonafluorobutyl group, an undecafluoropentyl group, a tridecafluorohexyl group, and a perfluorododecyl group. The substituent which the naphtyl group or the anthryl has includes C1-C4 alkyl group and C1-C4 alkoxy group.

Examples of the anion of formula (VIIIa) specifically include those as follow.

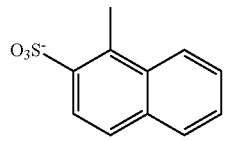
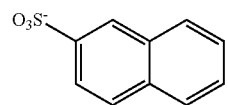

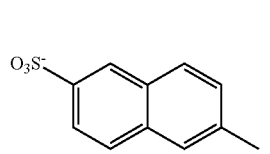
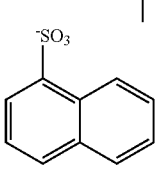

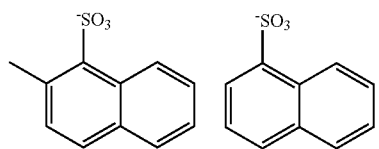

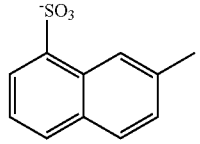

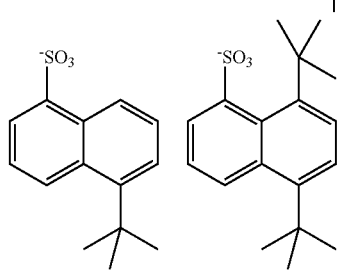

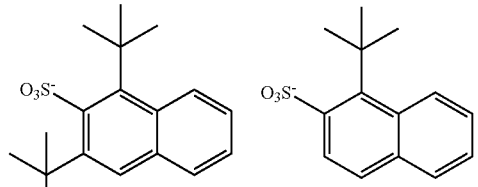

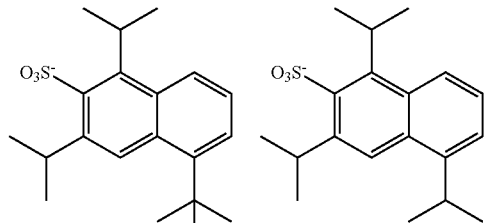

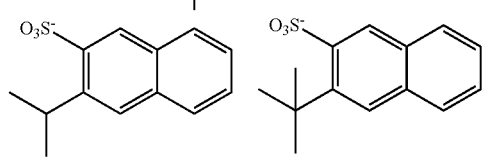

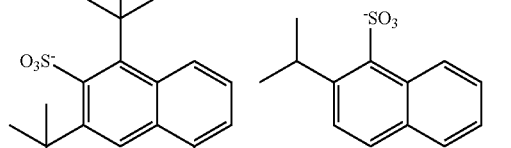

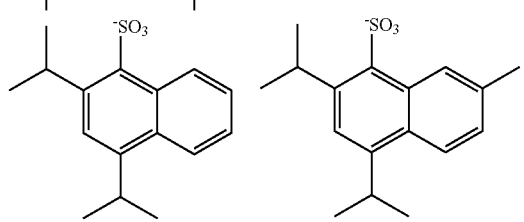

Examples of the organic anion represented by $Z^-$ of formulae (Va), (Vb), (Vc) and (III) include the anion of formula (VIIIb).

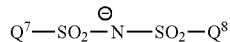
(VIIIb)

where $Q^7$ and $Q^8$ represent a C1-C20 perfluoroalkyl group, or a C6-C20 aryl group optionally having a C1-C4 alkyl group. In formula (VIIIb), the perfluoroalkyl group includes a trifluoromethyl group, a pentafluoroethyl group, a heptafluoropropyl group, a nonafluorobutyl group, an undecafluoropentyl group, a tridecafluorohexyl group and a perfluorododecyl group, and the aryl group includes a phenyl group or a naphthyl group.

Examples of the anion of formula (VIIIb) specifically include the anions as follow.

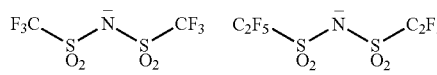

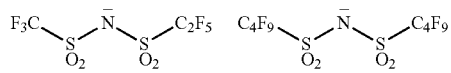

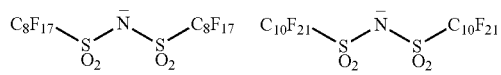

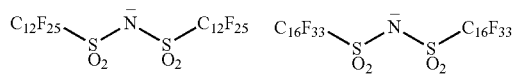

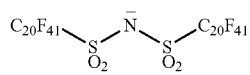

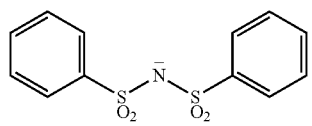

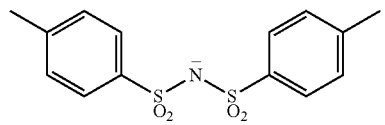

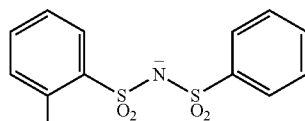

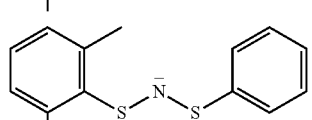

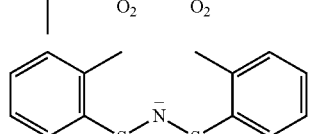

-continued

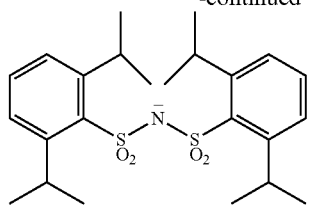

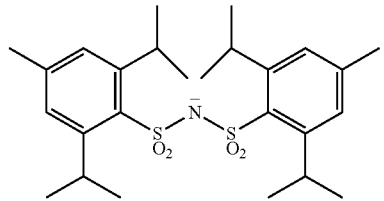

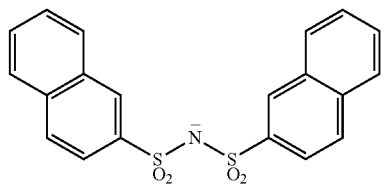

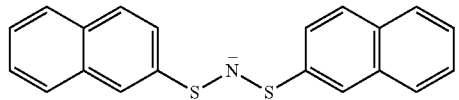

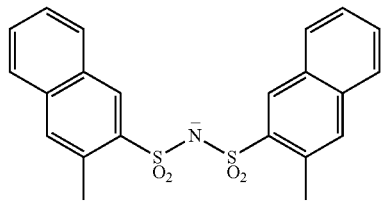

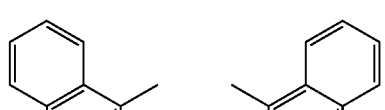

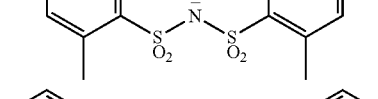

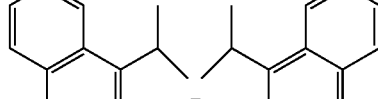

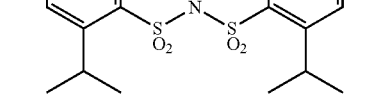

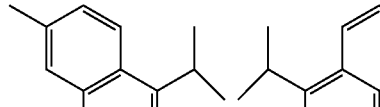

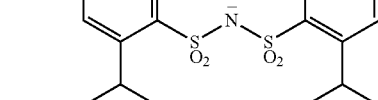

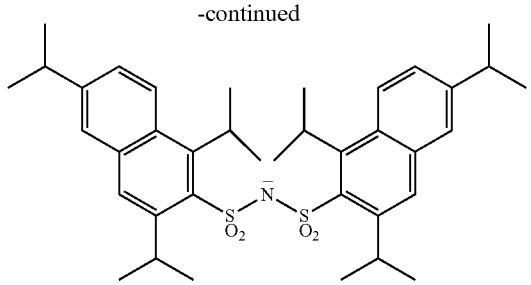

The acid generator for the present invention includes the compounds which comprise any one of the cations as specifically described and any one of the anions as specifically described.

Examples of the non-ionic acid generators include an organic sulfone compound such as the compounds of formulae (IV), (VI), (IX), (XI) and (XII);

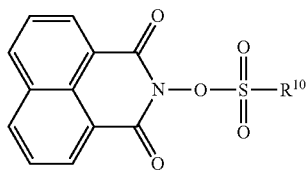
(IV)

where $R^{10}$ represents a C1-C8 perfluoroalkyl group, a C6-C16 aromatic hydrocarbon group optionally having a substituent, a C1-C12 alkyl group optionally having a substituent, or a C3-C16 cycloalkyl group optionally having a substituent, (VI)

where $A^1$ represents an oxygen atom or a sulfur atom, $R^7$ and $R^8$ represent a hydrogen atom, or a C1-C4 alkyl group, and $R^9$ represents a C1-C8 perfluoroalkyl group,

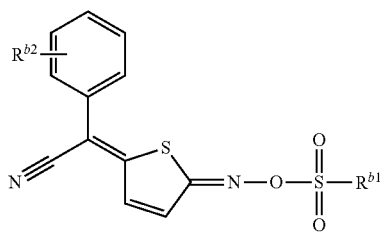
(IX)

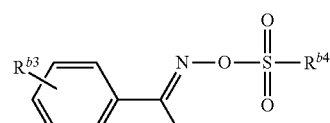
(XI)

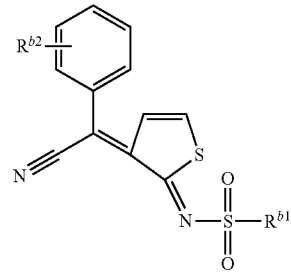
(XII)

where $R^{b1}$ and $R^{b4}$ each represents a C1-C18 hydrocarbon group optionally having a fluorine atom, and
$R^{b2}$ and $R^{b4}$ each represent a hydrogen atom and a C1-C5 alkyl group or a C1-C5 alkoxy group.

In formula (IV), examples of the C1-C8 perfluoroalkyl group are the same as those for formula (III). Examples of C1-C12 alkyl group include a methyl group, an ethyl group, a propyl group, a butyl group, a pentyl group, a hexyl group, a heptyl group, an octyl group, a decyl group, and a dodecyl group. Examples of C3-C16 cycloalkyl group include monocyclic groups such as a cyclopropyl group, a cyclobutyl group, a cyclopentyl group, a cyclohexyl group, a cycloheptyl group, a cyclooctyl group and, a cyclododecyl group. Examples of the substituent for the alkyl group and the cycloalkyl group include a halogen atom such as a fluorine atom or a chlorine atom; and a lactone ring.

Examples of the aromatic hydrocarbon group include a phenyl group and a naphthyl group. Examples of the substituent for the aromatic group include C1-C4 alkyl group and a halogen atom such as a fluorine atom or a chlorine atom.

In formula (VI), examples of the C1-C8 perfluoroalkyl group are the same as those for formula (III) and C1-C4 alkyl group are the same as those for formula (Vc).

The hydrocarbon group of formula (IX) includes a C1-C18 alkyl group such as a methyl group, an ethyl group, a propyl group, a butyl group, a pentyl group, a hexyl group, a heptyl group, an octyl group, a decyl group, and a dodecyl group;

a C3-C18 cycloalkyl group such as a cyclopropyl group, a cyclobutyl group, a cyclopentyl group, a cyclohexyl group, a cycloheptyl group, a cyclooctyl group, a cyclodecyl group, a cyclododecyl group and an adamantyl group; and a C6-C18 aryl group such as a phenyl group, a naphthyl group, an anthryl group, biphenyl group, phenanthryl group, fluorenyl group.

Examples of the compound of formula (IV) specifically include the compound as follow, preferably include the compounds of the formula where $R^{10}$ is C1-C4 perfluoroalkyl group.

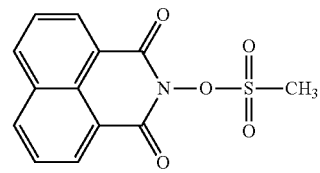

-continued
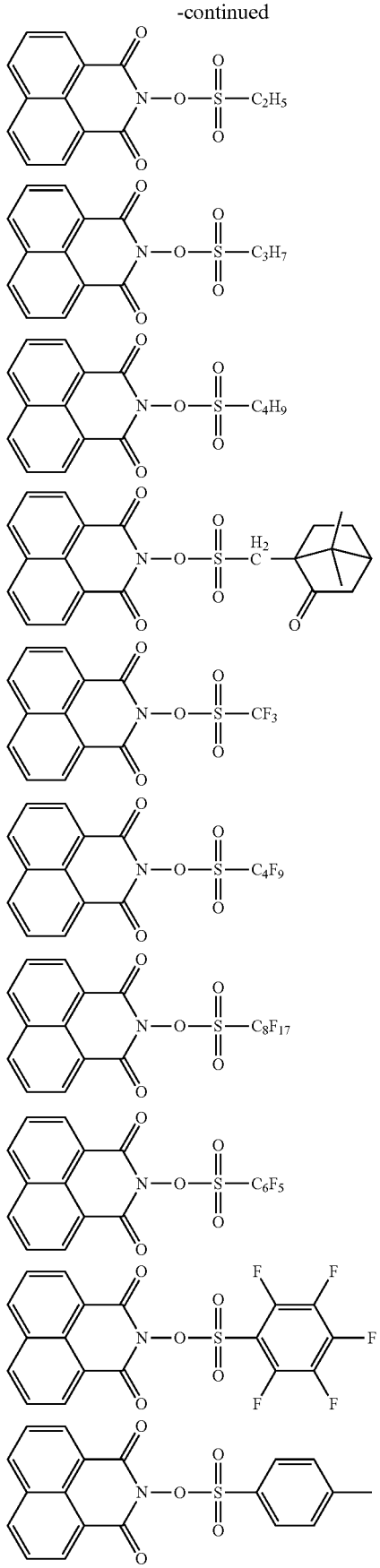
Examples of the compound of formula (VI) specifically include the compounds as follow.
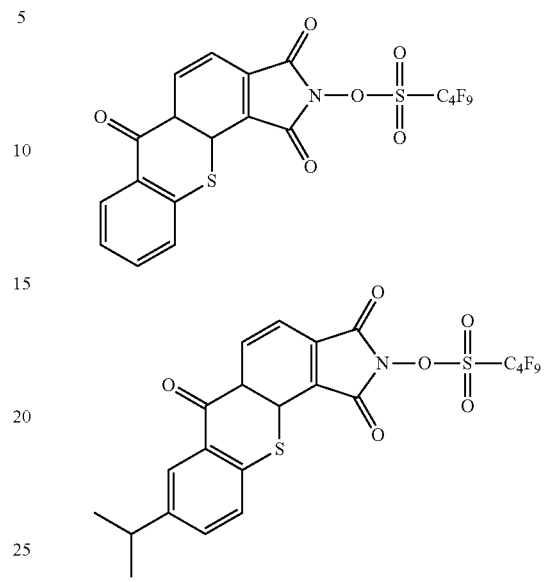
Examples of the compound of formula (IX) specifically include the compounds as follow.
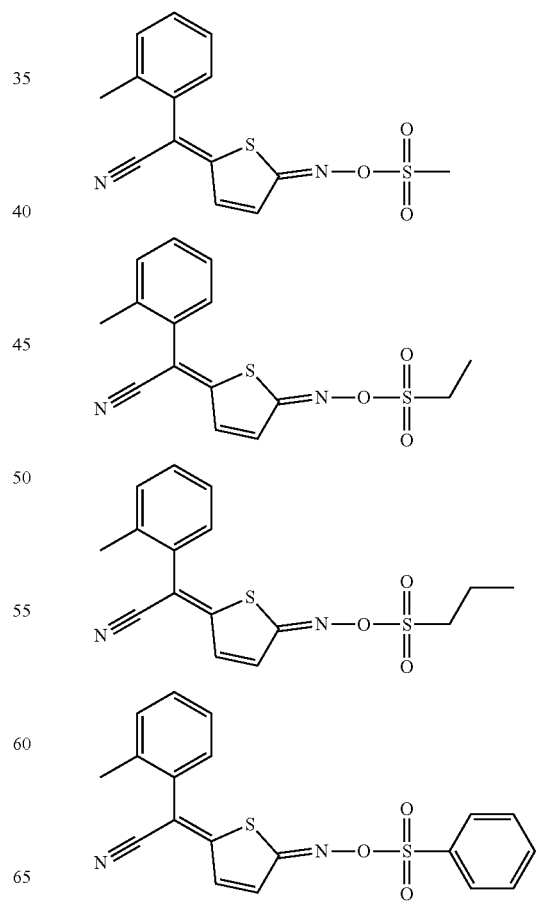

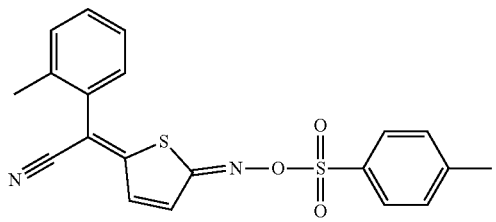

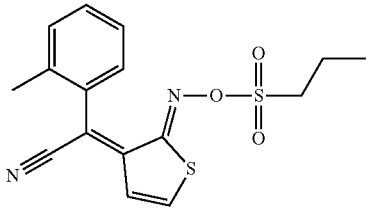

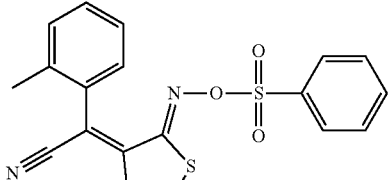

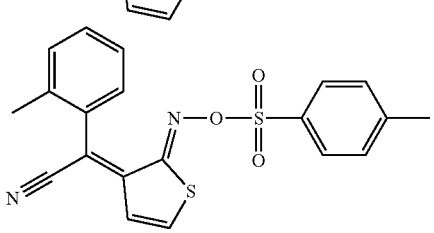

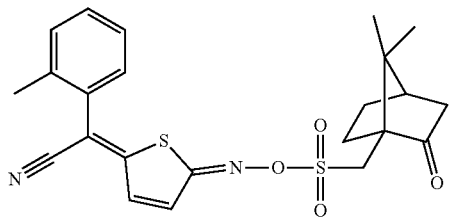

Examples of the compound of formula (XI) specifically include the compounds as follow.

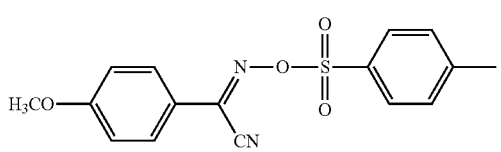

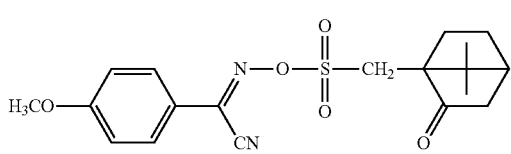

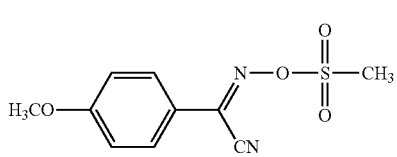

Examples of the compound of formula (XII) specifically include the compounds as follow.

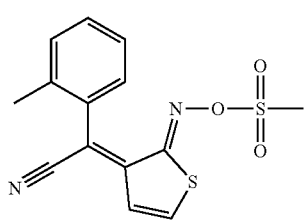

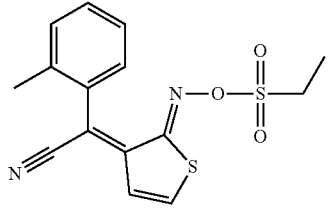

The acid generator for the present invention is preferably an organic sulfone compound, more preferably a compound represented by formula (IV) or (VI), still more preferably a compound represented by formula (IV).

The acid generator is available on the market, or it can be prepared by a known method.

The content of the acid generator is generally 0.05 to 5% by mole, preferably 0.1 to 1.0% by mole, of the total amount of the composition of the present invention.

The composition of the present invention may further comprise a basic compound known as a quencher for the photoresist compositions.

The basic compound includes an amine and an ammonium salt.

The amine includes an aliphatic amine and an aromatic amine. The aliphatic amine includes primary amine, secondary amine and tertiary amine.

The basic compound specifically includes the compounds of formulae (C1), (C2), (C3), (C4), (C5) and (C6), preferably a compound of formula (C1-1).

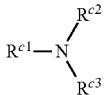

(C1)

wherein $R^{c1}$, $R^{c2}$ and $R^{c3}$ independently represent a hydrogen atom, a C1-C6 alkyl group, a C5-C10 alicyclic hydrocarbon group or a C6-C10 aromatic hydrocarbon group, and the alkyl group and the alicyclic hydrocarbon group can have a substituent selected from the group consisting of a hydroxy group, an amino group and a C1-C6 alkoxy group, and the aromatic hydrocarbon group can have a substituent selected from the group consisting of C1-C6 alkyl groups, a C5-C10 alicyclic hydrocarbon group, a hydroxy group, an amino group, and a C1-C6 alkoxy group,

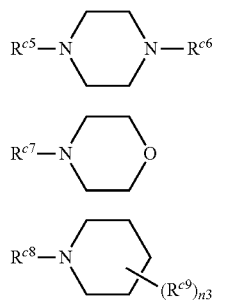

wherein $R^{c5}$, $R^{c6}$, $R^{c7}$ and $R^{c8}$ are defined same as $R^{c1}$, each of $R^{c9}$ independently represents a C1-C6 alkyl group, a C3-C6 alicyclic hydrocarbon group, or a C2-C6 alkanoyl group, and n3 represents an integer of 0 to 8,

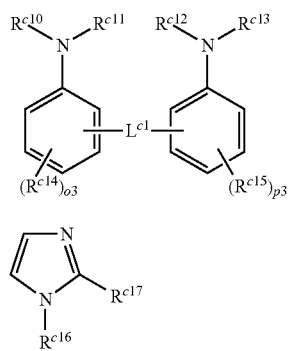

wherein each of $R^{c10}$, $R^{c11}$, $R^{c12}$, $R^{c13}$ and $R^{c16}$ is defined same as $R^{c1}$, each of $R^{c14}$, $R^{c15}$ and $R^{c17}$ is defined same as $R^{c4}$, $L^{c1}$ represents a C1-C6 alkanediyl group, —CO—, —C(=NH)—, —S— or a combination thereof, and o3 and p3 respectively represent an integer of 0 to 3,

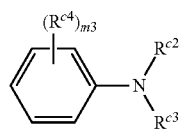

wherein $R^{c2}$ and $R^{c3}$ are defined as above, each of $R^{c4}$ independently represents a C1-C6 alkyl group, a C1-C6 alkoxy group, a C5-C10 alicyclic hydrocarbon group or a C6-C10 aromatic hydrocarbon group, and m3 represents an integer of 0 to 3. The compound of formula (C1) includes 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, diphenylamine, hexylamine, heptylamine, octylamine, nonylamine, decylamine, dibutylamine, dipentylamine, dihexylamine, diheptylamine, dioctylamine, dinonylamine, didecylamine, triethylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane. Among them, preferred is diisopropylaniline and more preferred is 2,6-diisopropylaniline The compound of formula (C2) includes piperazine.

The compound of formula (C3) includes morpholine.

The compound of formula (C4) includes piperidine and hindered amine compounds having a piperidine skeleton as disclosed in JP 11-52575 A1.

The compound of formula (C5) includes 2,2'-methylenebisaniline.

The compound of formula (C6) includes imidazole and 4-methylimidazole.

The ammonium salt includes tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

The compositions of the present invention usually comprise a solvent.

The solvent includes a glycol ether ester such as ethylcellosolve acetate, methylcellosolve acetate and propylene glycolmonomethylether acetate; an ester such as ethyl lactate, butyl acetate, amyl acetate and ethyl pyruvate; a ketone such as acetone, methylisobutylketone, 2-heptanone and cyclohexanone; and a cyclic ester such as γ 7-butyrolactone.

In the composition of the present invention, the solvent can make the composition possible to form a uniform and flat film.

The amount of the solvent is usually 20% by weight or more, preferably 30% by weight or more, more preferably 40% by weight or more based on total amount of the composition of the present invention. The amount of the solvent is usually about 80% by weight or less based on total amount of the composition of the present invention.

The compositions of the present invention may comprise if necessary, a small amount of various additives such as a sensitizer, a dissolution inhibitor, other polymers, a surfactant, a stabilizer and a dye as long as the effect of the present invention is not prevented.

The compositions of the present invention can usually be prepared by mixing, in a solvent, an acid generator, a resin, and the compound of formula (X), and if necessary additives at a suitable ratio for the composition, optionally followed by filtrating the mixture with a filter having from 0.001 to 0.2 μm of a pore size.

The order of mixing these components is not limited to any specific order. The temperature at mixing the components is usually 10 to 40° C., which can be selected in view of the resin or the like. The mixing time is usually 0.5 to 24 hours, which can be selected in view of the temperature. The means for mixing the components is not limited to specific one. The components can be mixed by being stirred.

The amounts of the components in the photoresist compositions can be adjusted by selecting the amount to be used for production of them.

The compositions of the present invention are suitable for producing thick photoresist films for bumps. The compositions can provide photoresist films with thickness in the range of usually 2 to 200 μm, preferably 4 to 150 μm, more preferably 5 to 100 μm.

The photoresist film obtained by applying the composition of the present invention on a substrate, the thickness of said film being in the above-mentioned ranges, is also one aspect of the present invention.

Bumps can be produced by the process comprising the following steps;

applying a conductive material (e.g. barrier metal) on a wafer of LSI devices to form a conductive film thereon, applying a photoresist composition on the conductive film, and exposing the composition, followed by developing to form a desired photoresist pattern, pattern plating using the photoresist pattern as the mold to make desired parts of conductive film exposed on the surface of the device, i.e. to form an electrode of the device, and removing the photoresist film from the device, followed by removing therefrom the other parts of conductive film previously covered with the removed photoresist film.

The composition of the present invention can provide a photoresist pattern on the substrate, and the pattern has excellent profile of its cross-section but less footing.

A photoresist pattern can be produced using the composition of the present invention by the following steps (1) to (5):

(1) a step of applying the photoresist composition of the present invention on a substrate, (2) a step of forming a photoresist film by conducting drying, (3) a step of exposing the photoresist film to radiation, (4) a step of baking the exposed photoresist film, and (5) a step of developing the baked photoresist film to form a photoresist pattern.

The applying of the composition on a substrate is usually conducted using a conventional apparatus such as spin coater.

The substrate includes a silicon wafer; a quartz wafer on which a sensor, a circuit, a transistor has been formed; the conductive materials; and insulating materials such as $SiO_2$ and polyimide.

The conductive material to be used for forming the conductive film includes a metal selected from the group consisting of gold (Au) copper (Cu), nickel (Ni), tin (Sn), palladium (Pd), titanium (Ti) and silver (Ag), and an alloy comprising the above-mentioned metals. Among them, copper and alloys comprising copper are preferred because of low costs.

The substrate comprises preferably a conductive material containing a metal, said metal being selected from the group consisting of gold, copper, nickel, tin, titanium and palladium, or $SiO_2$, and more preferably a conductive material containing a metal, said metal being selected from the group consisting of gold, copper, nickel, tin and palladium.

The substrate may be coated with a reflect-preventing layer such as one containing hexamethyldisilazane. For forming the reflect-preventing layer, such composition for organic reflect-preventing layer as available on the market can be used.

The photoresist film is usually formed by heating the coat layer with a heating apparatus such as hot plate or a decompressor, to thereby dry off the solvent. The heating temperature is preferably 50 to 200° C., and the operation pressure is preferably 1 to $1.0*10^5$ Pa. These conditions can be selected in view of the solvent.

The thickness of the photoresist film is in the range of preferably 4 to 150 μm, more preferably 5 to 100 μm.

The photoresist film is exposed to radiation using an exposure system. The exposure is usually conducted through a mask having a pattern corresponding to the desired photoresist pattern. The exposure source include a light source radiating laser light in a UV-region such as a KrF excimer laser, an ArF excimer laser and a F2 laser, and a light source radiating harmonic laser light in a far UV region or a vacuum UV region by wavelength conversion of laser light from a solid laser light source (such as YAG or semiconductor laser). The exposure source may be electric beam or extremely ultraviolet (EUV).

Exposure through a mask makes the composition film have exposed areas and unexposed area. At the exposed area, the acid generator contained in the component layer gives an acid due to exposure energy. The acid generated from the acid generator acts on an acid-labile group of the resin, so that the deprotection reaction proceeds, resulting that the resin shows hydrophilic. Therefore, the resin becomes soluble with an alkaline solution at exposed area of the composition film. On the other hand, unexposed area of the composition film remains insoluble or poorly soluble in an aqueous alkali solution even after exposure. The solubility for an aqueous alkali solution is much different between the exposed area and unexposed area.

The step of baking of the exposed photoresist film is so called post-exposure bake, which is conducted with heating means such as hot plates. The temperature of baking of the exposed photoresist film is preferably 50 to 200° C., and more preferably 70 to 150° C. The deprotection reaction further proceeds by post-exposure bake.

The development of the baked photoresist film is usually carried out with alkaline developer using a development apparatus.

The development can be conducted by contacting the baked photoresist film into with an aqueous alkaline solution to thereby remove the film at exposed area from the substrate while remain the film at unexposed area, forming the photoresist pattern. The alkaline developer to be used may be any one of various alkaline aqueous solution used in the art. Generally, an aqueous solution of tetramethylammonium hydroxide or (2-hydroxyethyl) trimethylammonium hydroxide (commonly known as "choline") is often used.

After development, the photoresist pattern formed is preferably washed with ultrapure water, and the remained water on the photoresist pattern and the substrate is preferably removed.

The composition of the present invention is suitable for producing a photoresist pattern to be used for bump production, because the composition can provide a photoresist pattern with less footing but with excellent profile.

EXAMPLES

The present invention will be described more specifically by Examples, which are not construed to limit the scope of the present invention.

The "%" and "part(s)" used to represent the content of any component and the amount of any material used in the following examples and comparative examples are on a weight basis unless otherwise specifically noted.

Structures of compounds were determined by mass spectrometry (Liquid Chromatography: 1100 Type, manufactured by AGILENT TECHNOLOGIES LTD., Mass Spectrometry: LC/MSD Type, manufactured by AGILENT TECHNOLOGIES LTD.). Hereinafter, the value of the peak in the mass spectrometry is referred to as "MASS".

The weight-average molecular weight of any material used in the following examples is a value found by gel permeation chromatography [HLC-8120GPC type, Column: Three of TSKgel Multipore HXL-M with guard column, manufactured by TOSOH CORPORATION, Solvent: tetrahydrofuran, Flow rate: 1.0 mL/min., Detector: RI Detector, Column temperature: 40° C., Injection volume: 100 µL] using standard polystyrene as a standard reference material.

Reference Example 1

To a four-necked flask with a stirring device, a reflux condenser and a thermometer, 118 g of 1,4-dioxane was added and then heated to 77° C.
Dissolved were 42.7 g of methacrylate tert-butyl, 29.8 g of polyethyleneglycolmethylether methacrylate (Trade name: light ester 130MA, Kyoeisha Chemistry Co., Ltd.; The compound of formula (II) where n is approximately 9), 45.2 g of methoxydiethyleneglycol methacrylate and 0.4 g of azobisisobutyronitrile in 59 g of 1,4-dioxane. The obtained solution was dropped to the heated 1,4-dioxane over 1 hour, followed by stirring them at 77° C. for 10 hours.
Then the reaction mixture was cooled and then diluted with 130 g of methanol and 92 g of propyleneglycolmethylether acetate. The diluted reaction mixture was poured into 1440 g of water to make the resin precipitate. The precipitated resin was collected by filtration and dissolved in 184 g of propyleneglycolmethylether acetate, followed by pouring the solution into a mixture of 423 g of methanol and 918 g of water to make the resin precipitate. The obtained precipitates were dissolved in propyleneglycolmethylether acetate and then concentrated to obtain 40% by weight of resin solution.
The obtained resin is referred to as "Resin A1", the weight average molecular weight of which was 110000.

Reference Example 2

To a four-necked flask with a stirring device, a reflux condenser and a thermometer, 413 g of 2,5-xylenol, 103.4 g of salicylaldehyde, 20.1 g of p-toluenesulfonic acid and 826.9 g of methanol were poured, and heated to make the mixture refluxed and then the temperature of the mixture was kept for 4 hours. Then the obtained mixture was cooled, and 1320 g of methylisobutylketone was fed thereto, followed by distilling it under ordinary pressure until the amount of residues became 1075 g.
Then 762.7 g of m-cresol and 29 g of 2-tert-butyl-5-methylphenol were added to the residues and heated to 65° C., followed by dropping 678 g of 37% formalin thereto over 1.5 hours while controlling the temperature of the mixture to be 87° C. at the end of dropping. Then the temperature of the mixture was kept at 87° C. for 10 hours, and then 1115 g of methylisobutylketone was added to the obtained resin solution, followed by washing it with water three times. To the washed resin solution, 3796 g of methylisobutylketone and 4990 g of n-heptane were added and heated to 60° C., and then stirred for 1 hour, followed by separating therefrom the sticky resin solution of the bottom layer. To the separated resin solution, 3500 g of propyleneglycolmonomethylether acetate was added to dissolve it, followed by distilling until the amount of solution became 1690 g.
The obtained resin is referred to as "Resin A2", the weight average molecular weight of which was 7000.

Examples 1 to 5 and Comparative Example 1

The resin, acid generator and compound X1, X2, X3, X4 or C1 were mixed and dissolved in the solvent shown in Table 1, and further filtrated through a fluorine resin filter having pore diameter of 0.5 µm to prepare photoresist compositions.

TABLE 1

| Example No. | Resin (Kind/parts) | Acid generator (Kind/parts) | Compound (Kind/parts) |
| --- | --- | --- | --- |
| Ex. 1 | A1/7.4 | A2/5.74 | B1/0.3 | X1/0.08 |
| Ex. 2 | A1/7.4 | A2/5.74 | B1/0.3 | X1/0.05 |
| Ex. 3 | A1/7.4 | A2/5.74 | B1/0.3 | X2/0.05 |
| Ex. 4 | A1/7.4 | A2/5.74 | B1/0.3 | X3/0.05 |
| Ex. 5 | A1/7.4 | A2/5.74 | B1/0.3 | X4/0.05 |
| Compar. Ex. 1 | A1/7.4 | A2/5.74 | B1/0.3 | C1/0.05 |

<Resin>
A1: Resin A1
A2: Resin A2
<Acid Generator>
B1: The compound of formula

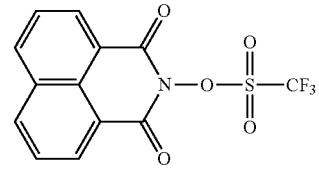 [SMILES: O=C1c2cccc3cccc(c23)C(=O)N1OS(=O)(=O)C(F)(F)F]

<Compound>
Compound X1: 2,9-dimethyl-4,7-diphenyl-1,10-phenanthroline
Compound X2: 1,10-phenanthroline
Compound X3: 4,7-dihydroxy-1,10-phenanthroline
Compound X4: 2,9-dimethyl-1,10-phenanthroline
Compound C1: N,N-dicyclohexylmethylamine
<Solvent>
Propyleneglycolmonomethylether Acetate 24 Parts
(Preparation of Photoresist Pattern)
Each of the photoresist compositions prepared as above was spin-coated over cupper substrate so that the thickness of the resulting film became 20 µm after drying. The cupper substrates thus coated with the respective photoresist compositions were each prebaked on a direct hotplate at 130° C. for 3 minutes.
Using an i-ray stepper ("NSR 1755i7A" manufactured by Nikon, NA=0.5), each wafer thus formed with the respective resist film was subjected to line and space pattern exposure with the exposure quantity being varied stepwise. The exposure was conducted with a mask having line and space pattern (20 µm F.T. L/S). The mask had the light-shielding parts made of chromium and the light-transmissive parts made of glass.
After the exposure, each wafer was subjected to post-exposure baking on a hotplate at 90° C. for 3 minutes, and then to paddle development for 60 seconds with an aqueous solution of 2.38 wt % tetramethylammonium hydroxide. The paddle development was conducted three times.
After the development, line and space pattern was observed with a scanning electron microscope.

53

(Evaluation of Profile)

I. Footing

The photoresist patterns were obtained by the process where the exposure was conducted at the exposure quantity of ES using the above-mentioned mask, and then each pattern was observed with a scanning electron microscope. Herein, the ES (Effective Sensitivity) was expressed as the exposure quantity that the line width of the line and space pattern of 20 μm became 1:1 after exposure through a mask having line and space pattern (line size: 20 μm).

As to the size of the width between adjacent lines determined from the cross-section, the widest size was defined as "S" and the size at the substrate was defined as "B" (as shown in FIG. 1).

When the value B/S is not more than 1 and not less than 0.9, the pattern has less footing, marked by "o".

When the value B/S is less than 0.9 but not less than 0.75, the pattern has footing at some level, marked by "Δ".

When the value B/S is less than 0.75, the pattern has footing at high level, marked by "x".

II. Profile

The photoresist patterns were obtained by the process where the exposure was conducted at the exposure quantity of ES using the above-mentioned mask, and then the cross-section of each pattern was observed with a scanning electron microscope.

Figure 2:
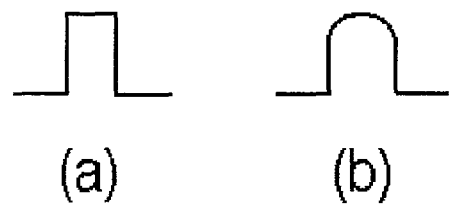
FIG. 2 simply illustrates a typical cross-section view of photoresist pattern in order to explain profiles of the patterns evaluated in Examples 1 to 5 and Comparative Example 1.

When the shape at the top part of its cross-section is rectangular or the like as shown FIG. 2(a), the pattern is marked by "o".

When the shape at the top part of its cross-section is not rectangular or the like as shown FIG. 2(b), the pattern is marked by "x".

III. Scum

The photoresist patterns were obtained by the process where the exposure was conducted at the exposure quantity of ES using the above-mentioned mask, and then the existence of scum in each pattern was checked with a scanning electron microscope.

IV. Resolution

Resolution is expressed as the minimum size of the line of the pattern which is capable of making a pattern on the substrate when the exposure was conducted at exposure quantity of ES.

The results of the evaluation are listed in Table 2.

TABLE 2

|  | Footing | Profile | Scum | Resolution (μm) |
|---|---|---|---|---|
| Ex. 1 | o | o | None | 3.6 |
| Ex. 2 | o | o | None | 3.2 |
| Ex. 3 | o | o | None | 4.0 |
| Ex. 4 | o | o | None | 4.0 |
| Ex. 5 | o | o | None | 4.0 |
| Comp. Ex. 1 | x | x | Existed | 6.0 |

V. Storage Stability

The photoresist compositions of Examples 1 and 2 had been stored at 40° C. for 30 days. With the photoresist compositions after the storage, the photoresist patterns were made as described above, and the footing, profile and resolution of them were evaluated as described above. The results of these photoresist compositions after storage were almost identical to those of the composition before storage.

The photoresist composition of Comparative Example 1 had been stored at 40° C. for 15 days. With the photoresist composition after the storage, the photoresist pattern was made as described above, and the footing, profile and resolution of them were evaluated as described above. As to the results as to footing and profile, the photoresist composition after storage were worse than the composition before storage. The composition after storage showed the value of resolution larger by more that 10% of the value which the composition before storage showed.

The composition of the present invention is suitable to production of photoresist pattern for semiconductor processing, specifically bump.

What is claimed is:

1. A chemical amplified photoresist composition comprising a resin which comprises a structural unit having an acid-labile group, a novolak resin, an organic sulfone compound, and a compound of formula (X'):

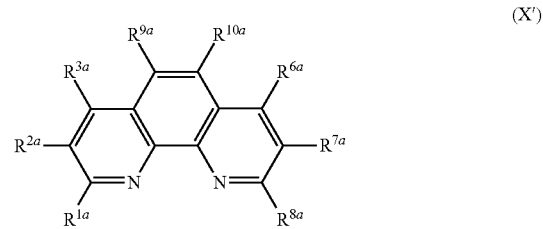

(X')

wherein $R^{1a}$, $R^{2a}$, $R^{3a}$, $R^{6a}$, $R^{7a}$, and $R^{8a}$ each independently represent a hydrogen atom, a hydroxyl group, a carboxy group, —$SO_3$, —$NH_2$, a halogen atom, a mercapto group, a C1-C12 alkyl group optionally having a substituent, a C6-C30 aryl group optionally having a substituent, or a C3-C12 cycloalkyl group optionally having a substitutent, $R^{9a}$ and $R^{10a}$ each independently represent a hydrogen atom, a hydroxyl group, a carboxy group, —$SO_3$, —$NH_2$, a halogen atom, a mercapto group, a C1-C12 alkyl group optionally having a substituent, a C6-C30 aryl group optionally having a substituent, or a C3-C12 cycloalkyl group optionally having a substituent.

2. The chemical amplified photoresist composition according to claim 1, wherein $R^{1a}$, $R^{2a}$, $R^{3a}$, $R^{6a}$, $R^{7a}$, and $R^{8a}$ each independently represent a hydrogen atom, a hydroxyl group, a carboxy group, a methyl group or a phenyl group.

3. The chemical amplified photoresist composition according to claim 1, wherein $R^{1a}$, $R^{2a}$, $R^{3a}$, $R^{6a}$, $R^{7a}$, and $R^{8a}$ each independently represent a hydrogen atom, a hydroxyl group, a methyl group or a phenyl group.

4. The chemical amplified photoresist composition according to claim 1, wherein the compound of formula (X') is 2,9-dimethyl-4,7-diphenyl-1,10-phenanthroline, 1,10-phenanthroline, 4,7-dihydroxy-1,10-phenanthroline, or 2,9-dimethyl-1,10-phenanthroline.

5. The chemical amplified photoresist composition according to claim 1, wherein the compound of formula (X') amounts to from 0.001 to 1% by mass of the composition.

6. The chemical amplified photoresist composition according to claim 1, wherein the acid generator is a compound represented by formula (IV) or (VI);

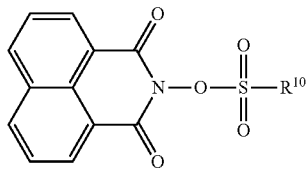
(IV)

where $R^{10}$ represents a C1-C8 perfluoroalkyl group, a C6-C16 aromatic hydrocarbon group optionally having a substituent, a C1-C12 alkyl group optionally having a substituent, or a C3-C16 cycloalkyl group optionally having a substituent,

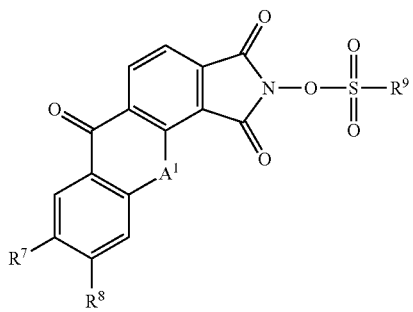
(VI)

where $A^1$ represents an oxygen atom or a sulfur atom,
$R^7$ and $R^8$ represent hydrogen atom, or a C1-C4 alkyl group,
and $R^9$ represents a C1-C8 perfluoroalkyl group.

7. The chemical amplified photoresist composition according to claim 1, which further comprises a solvent.

8. A process for producing a photoresist pattern comprising:
   (1) a step of applying the chemical amplified photoresist composition according to claim 1 on a substrate to form a photoresist composition film,
   (2) a step of forming a photoresist film by drying the photoresist composition film,
   (3) a step of exposing the photoresist film to radiation,
   (4) a step of heating the photoresist film after exposing, and
   (5) a step of developing the heated photoresist film.

9. The process according to claim 8 wherein the substrate comprises a conductive material containing a metal, said metal being selected from the group consisting of gold, copper, nickel, tin and palladium.

10. A photoresist film comprising the chemical amplified photoresist composition according to claim 1, wherein the thickness of said film is in the range from 4 to 150 μm.

* * * * *